United States Patent
Lin et al.

(10) Patent No.: US 7,154,798 B2
(45) Date of Patent: Dec. 26, 2006

(54) MRAM ARRAYS AND METHODS FOR WRITING AND READING MAGNETIC MEMORY DEVICES

(75) Inventors: Wen-Chin Lin, Hsin-Chu (TW); Denny Tang, Saratoga, CA (US); Li-Shyue Lai, Hsinchu County (TW); Chao-Hsiung Wang, Hsin-Chu (TW); Fang-Shi Jordan Lai, Chia Yi (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 5 days.

(21) Appl. No.: 11/115,422

(22) Filed: Apr. 27, 2005

(65) Prior Publication Data

US 2005/0243598 A1 Nov. 3, 2005

Related U.S. Application Data

(60) Provisional application No. 60/565,649, filed on Apr. 27, 2004.

(51) Int. Cl.
*G11C 7/02* (2006.01)
(52) U.S. Cl. .................. 365/209; 365/158; 365/173; 365/205
(58) Field of Classification Search ............ 365/158, 365/173, 205, 209
See application file for complete search history.

(56) References Cited

U.S. PATENT DOCUMENTS

| 5,640,343 | A | 6/1997 | Gallagher et al. |
|---|---|---|---|
| 6,317,375 | B1 | 11/2001 | Perner |
| 6,421,271 | B1 | 7/2002 | Gogl et al. |
| 6,545,906 | B1 | 4/2003 | Savtchenko et al. |
| 6,606,263 | B1 | 8/2003 | Tang |
| 6,711,053 | B1 | 3/2004 | Tang |
| 6,744,651 | B1 | 6/2004 | Tang |
| 6,744,663 | B1 | 6/2004 | Garni et al. |
| 6,760,266 | B1 | 7/2004 | Garni et al. |
| 6,778,433 | B1 | 8/2004 | Tang |
| 6,914,808 | B1 * | 7/2005 | Inaba ................. 365/158 |
| 2004/0057263 | A1 | 3/2004 | Tang |
| 2004/0080977 | A1 | 4/2004 | Tang |
| 2004/0160251 | A1 | 8/2004 | Lin et al. |
| 2004/0160809 | A1 | 8/2004 | Lin et al. |
| 2005/0073881 | A1 * | 4/2005 | Tran et al. ............ 365/158 |

* cited by examiner

*Primary Examiner*—Hoai V. Ho
(74) *Attorney, Agent, or Firm*—Baker & McKenzie LLP

(57) ABSTRACT

A non-destructive technique and related array for writing and reading magnetic memory cells, including sampling a first signal of a selected read line corresponding to select memory cells, applying a magnetic field to the select memory cells, sampling a second signal of the selected read line, and comparing the first and second signals to determine a logic state of the select memory cells.

20 Claims, 25 Drawing Sheets

MRAM ARRAYS AND METHODS FOR WRITING AND READING MAGNETIC MEMORY DEVICES

PRIORITY CLAIM AND RELATED APPLICATIONS

This Application claims the benefit of U.S. Provisional Patent Application having Ser. No. 60/565,649, filed Apr. 27, 2004, and entitled "MRAM DEVICE FOR REDUCED SNEAK CURRENT AND HIGH DENSITY," which is hereby incorporated by reference in its entirety for all purposes. This Application is also related to the following commonly-assigned U.S. Patent Applications, the entire disclosures of which are also hereby incorporated herein by reference for all purposes:
"MULTI-SENSING LEVEL MRAM STRUCTURES," application Ser. No. 10/685,824, filed Oct. 13, 2003, having Wen Chin Lin and Denny D. Tang named as inventors.
"MULTI-SENSING LEVEL MRAM STRUCTURE WITH DIFFERENT MAGNETORESISTANCE RATIOS," application Ser. No. 10/678,699, filed Oct. 3, 2003, having Wen Chin Lin and Denny D. Tang named as inventors.
"NON-ORTHOGONAL WRITE LINE STRUCTURE IN MRAM," application Ser. No. 10/827,079 having Wen Chin Lin, Denny D. Tang and Li Shyue Lai named as inventors.

TECHNICAL FIELD

Disclosed embodiments herein relate generally to Magnetoresistive Random Access Memory (MRAM) arrays having magnetic tunnel junction (MTJ) memory devices, and more particularly to MRAM arrays and circuits for reading and writing multiple MTJ cells while reducing sneak currents.

BACKGROUND

An MTJ memory device comprises three basic layers, a free ferromagnetic layer, an insulating tunneling barrier, and a pinned ferromagnetic layer. The magnetization moments of the free ferromagnetic layer are free to rotate under an external magnetic field. The pinned ferromagnetic layer can comprise a ferromagnetic layer and/or an anti-ferromagnetic layer that pins the magnetic moments in the ferromagnetic layer. Thus, the magnetization moment of the pinned ferromagnetic layer is pinned in a fixed direction. A very thin insulation layer forms the tunneling barrier between the pinned and free ferromagnetic layers.

The MTJ memory device can be electrically represented as a resistor. The size of the resistance depends upon the orientation of the magnetization of the free ferromagnetic layer and the pinned ferromagnetic layer. As is understood by those skilled in the art, the MTJ memory device has a relatively high resistance when the magnetic vectors are misaligned (point in opposite directions) and a relatively low resistance when the magnetic vectors are aligned. That is, an MTJ memory device stores a bit of information as the relative orientation of the magnetizations of the free ferromagnetic layer and the pinned ferromagnetic layer. In other words, the magnetization of each MTJ memory device at any given time assumes one of two stable orientations. These two stable orientations, referred to as "parallel" and "anti-parallel" magnetic orientation, represent logic values of "0" and "1", for example.

To write or change the state in the MTJ memory device, an external magnetic field can be applied that is sufficient to completely switch the stable orientation of the magnetization of the free ferromagnetic layer. To sense states in the MTJ memory device, a read current can be applied through the MTJ memory device. As the magneto-resistance varies according to the state stored in the MTJ memory device, the logic state of the MTJ memory device can be sensed by obtaining the voltage difference across the MTJ memory device. An MRAM array comprises a plurality of MTJ memory devices, and the binary logic data of entire MRAM array is typically read by applying a sensing current flowing perpendicularly through selected MTJ memory device. Switches are implemented in conventional methods to block the stray read current path. In addition, the switches are also used to avoid write disturbance.

Switching devices such transistors and/or diodes are often employed to block current leakage or "sneak" current often occurring in the MRAM circuitry, usually during the read operation for the MTJ devices. The switching devices are employed to block sneak current paths in the MRAM array that might otherwise be present. In addition, such switches are also used to avoid write disturbance during writing operations. For example, some "non-disturbing" programming circuit designs employ two transistors for each MTJ device or memory "cell" or "bit." However, such designs provide insufficient cell density due to the relatively large area occupied by the switching device in relation to the MTJ cell. Another approach employs one transistor or diode for each bit to control the read current and block the sneak current paths, although such designs also do not offer sufficiently MRAM density for today's market demands.

In U.S. Pat. No. 6,606,263, Tang discloses a non-disturbing programming scheme for an MRAM array. FIG. 1 shows the structure of the 2T1R MRAM cell 100 disclosed in Tang. To write data to memory element 14A, switches 10A and 10B are selected, and the magnetic field generated by write current $I_W$ through program line 15A switches the direction of the magnetic moments of the free ferromagnetic layer of memory element 14A. When switch 10C is selected, read current $I_T$ flows through bit line 12, memory element 14B, program line 15A, and switch 10C. Thus, data stored in memory element 14B is obtained by sensing the voltage level of bit line 12. While the cell structure in FIG. 1 effectively eliminates write disturbance, the cell density of the MRAM structure in FIG. 1 is poor.

In U.S. Pat. No. 5,640,343, Gallagher disclosed a magnetic memory array using magnetic tunnel junction devices in the memory cells. FIG. 2 shows the circuit 200 disclosed in Gallagher, which uses one switch for one bit to control the sense current and block all stray paths. A selected cell 20A is written by passing current $I_B$ through bit line 22A, and current $I_W$ through word line 24A. According to the "asteroid curve," the magnetic field produced by either $I_B$ or $I_W$ alone in the region of the cells is less than the magnetic field required to change the magnetic state in a cell, thus, half-selected cells 20B (those over which only $I_B$ or $I_W$ alone is passing) are not written. The combination of magnetic fields from $I_B$ and $I_W$ is, however, sufficient to change the state of selected memory cell 20A.

In a read operation, a forward bias voltage is established across the selected cell 20A by pulling the word line 24 voltage down, and raising the bit line 22 voltage. In addition, unselected bit lines 24B and word lines 22B remain at standby voltages, thus, half-selected cells have a zero voltage drop from word line to bit line and do not conduct. The data stored in selected cell 20A is obtained by sensing the resistance thereof. The resistance of the selected cell determines the sense current that flows from the selected bit line to the selected word line through the selected memory cell.

U.S. Pat. No. 6,317,375 to Perner discloses a method and apparatus for reading memory cells of a resistive cross point array using a 2-step reading method with a specific voltage arrangement to block or reduce the sneak current. FIG. 3 depicts the cross point array 300 having a plurality of magnetic tunnel junction (MTJ) memory cells 31. The cross point array 300 includes n row lines 32 (also referred to as word lines) and m column lines 33 (also referred to as bit lines) that are perpendicular and pass over the row lines 32. An MTJ memory device 31 is located at an intersecting region of a row line 32 and a column line 33. The memory cell 31 is an MTJ device connected in series between a row line 32 and a column line 33.

FIGS. 4A and 4B are illustrations of sense and sneak path currents flowing through an electrical equivalent of a resistive cross point array (400A and 400B, respectively) of the device shown in FIG. 3. FIG. 4A shows an electrical equivalent of the memory cell array. A selected memory cell is represented by a first resistor 42A, and unselected memory cells are represented by second, third and fourth resistors 42B, 42C and 42D. The second resistor 42B represents the unselected memory cells along the selected bit line, the third resistor 42C represents the unselected memory cells along the selected word line, and the fourth resistor 42D represents the remaining unselected memory cells. If, for example, all of the memory cells 31 have a nominal resistance of about R and the array has n rows and m columns, then the second resistor 42B has a resistance of about R/(n−1), the third resistor 42C has a resistance of about R/(m−1), and the fourth resistor 42D has a resistance of about R/[(n−1)(m−1)].

The first resistor 42A maybe selected by applying the array voltage (Vs) to the crossing bit line and a ground potential to the crossing word line. Consequently, sense current ($I_S$) flows through the first resistor 42A. However, the second, third and fourth resistors 42B, 42C and 42D are also coupled between the array voltage (Vs) and the ground potential. To mitigate the effects of sneak path currents during read operations, the same operating potential Vb=Vs is applied to the unselected bit line. If Vb=Vs, sneak path currents are blocked from flowing through the second and fourth resistors 42B and 42D, and a sneak path current S3 flowing through the third resistor 52C will be directed to the ground potential and, therefore, will not interfere with the sense current ($I_S$).

Alternatively, the effects of the sneak path currents may be mitigated by applying the same operating potential Vb=Vs to the unselected word line, as shown in FIG. 4B. A sneak path current is blocked from flowing through the second resistor 42B. Sneak path currents S3 and S4 flowing through the third and fourth resistors 42C and 42D are not directed to the ground potential and, therefore, will not interfere with the sense current ($I_S$). Thus, applying an equal potential to the unselected bit or word lines of the array can eliminate or reduce obscuration of the sense current ($I_S$). Consequently, the sense current ($I_S$) and, therefore, the resistance state of the selected memory cell are reliably determined. The circuitry disclosed in Perner provides a high MRAM cell density because no transistor is implemented for each bit. However, the reading method disclosed in Perner requires large power consumption and complicated circuitry because unselected word lines and bit lines are supplied additional bias during a reading procedure.

U.S. Pat. No. 6,421,271 to Gogl discloses an MRAM configuration 500, illustrated in FIG. 5, which comprises bit line 50 and word lines 51A and 51B crossing bit line 50 essentially perpendicularly, at a distance from one another. MTJ memory devices 51–54 are located between bit line 50 and word line 51A, and MTJ memory devices 55–58 are located between bit line 50 and word line 51B. The ends situated opposite bit line 50 of the memory cells 51–54 are connected with a drain or source of a switching transistor Tr1, while the ends situated opposite bit line 50 of memory cells 55–58 are connected to a drain or source of a switching transistor Tr2. A gate of transistor Tr1 is connected to word line 51A, and a gate of transistor Tr2 is connected to word line 51B. The source or drain of the switching transistors Tr1 and Tr2 are grounded.

During a read process, a predetermined voltage of 1V to 2V is applied to bit line 50. The transistors of all the word lines, except for the transistors of a particular word line, are thereby blocked. It is assumed here that in the example the transistors of word line WL1 conduct, i.e., in the example, transistor Tr1 is supposed to be turned ON. If now, for example, the MTJ memory device 52 is in a low-ohmic state (parallel magnetization of the two magnetic layers), while the remaining MTJ memory devices 51, 53 and 54 are in a high-ohmic state (anti-parallel magnetization of the magnetic layers), on word line 51A a corresponding signal is obtained that differs from the signal that is present on word line when all the TMR memory cells are in a high-ohmic state. In order to determine which of the memory cells 51–54 is in the low-ohmic state, a self-reference sensing scheme is implemented. This read method, however, is known as destructive-read, and a consequent procedure of data-restoration is required. Destructive rewriting of the original data to the read memory cell subsequent to the reading procedure consumes excess time and power.

BRIEF SUMMARY

Disclosed herein are MRAM arrays and methods employing non-destructive writing and reading of MTJ memory device. One embodiment of a non-destructive method of reading a memory cell includes sampling a first signal of a selected read line corresponding to the memory cell, applying a temporary magnetic field to the memory cell, sampling a second signal of the selected read line, and comparing the first and second signals to determine a logic state of the memory cell. Data stored in the MTJ device can then be determined based on detected changes in resistance through the MTJ device before and during application of the magnetic field.

In another aspect, an array of magnetic memory cells is disclosed. Each of the memory cells comprise a stack of a free ferromagnetic layer, a pinned ferromagnetic layer, and an insulating tunneling barrier located therebetween, wherein a combination of a writing signal and a magnetic field may exceed a threshold magnetic field of corresponding select memory cells to alter the resistance of those memory cells. In such embodiments, the array comprises a plurality of magnetic memory cells coupled together, and first conductive lines corresponding to each of the plurality of memory cells for applying an adjustable signal proximate to select ones of the memory cells to be read, where the adjustable signal creates a magnetic field sufficient to alter a magnetic moment of the select memory cells. The array also comprises a second conductive line perpendicular to the first conductive line for applying a first read signal through the plurality of memory cells, and for applying a second read signal to the plurality of memory cells while the adjustable signal is applied to the select memory cells. Also included is a sensing circuit coupled to the second conductive line and configured to compare the first reading signal to the second reading signal to determine a logic state of each of the select memory cells. Variations of MRAM arrays can include such an array, as well as:

Other methods of determining a logic state of select magnetic memory cells on an array are also disclosed. In such aspects, each of the memory cells comprise a stack of a free ferromagnetic layer, a pinned ferromagnetic layer, and an insulating tunneling barrier located therebetween, wherein a combination of a writing signal and a magnetic field may exceed a threshold magnetic field of corresponding select memory cells to alter the resistance of those memory cells. In one embodiment, such a method comprises applying a first signal through a plurality of the memory cells coupled together, and detecting the first signal. In addition, the method includes applying an adjustable signal proximate to the select memory cells, where the adjustable signal creates a magnetic field sufficient to alter a magnetic moment of the select memory cells, and then applying a second signal to the plurality of memory cells while applying the adjustable signal and detecting the second signal. Also, such methods comprise comparing the second signal to the first signal to determine a logic state of each of the select memory cells.

Another embodiment of a method for reading a magnetic memory cell comprises providing a MTJ memory device comprising a free ferromagnetic layer, a pinned ferromagnetic layer, and an insulating tunneling barrier located between the pinned ferromagnetic layer and the free ferromagnetic layer. In such an embodiment, a magnetic moment of the free ferromagnetic layer is freely changeable, a magnetic moment of the pinned ferromagnetic layer is fixed. Thus, the MTJ memory device has a first static resistance or a second static resistance, and the resistance of the MTJ memory device is switched when an external magnetic field applied to the MTJ memory device exceeds a threshold magnetic field of the free layer. The method also includes applying a self-reference sensing scheme to compare two signals (e.g., voltage or current) before and during a wiggle magnetic field that rotates the magnetic moment of the free ferromagnetic layer by an angle not exceeding 90 degree. The data stored in the MTJ memory device is determined from the comparing of the first signal and the second signal.

In addition, an embodiment of an MRAM array circuit includes a data line for providing a selection signal during a data reading procedure, a word line for providing a first writing magnetic field during a data writing procedure, and a bit line across the word line for applying a voltage during the data reading procedure. In addition, such an array includes a switch comprising a control gate coupled to the data line, a first terminal coupled to the bit line, and a second terminal, wherein the switch is turned ON when receiving the selection signal. The array further includes a plurality of MTJ memory devices coupled between the second terminal and the word line, where each MTJ memory device comprises a free ferromagnetic layer, a pinned ferromagnetic layer, and an insulating tunneling barrier located between the pinned ferromagnetic layer and the free ferromagnetic layer, wherein a magnetic moment of the free ferromagnetic layer is freely changeable, a magnetic moment of the pinned ferromagnetic layer is fixed, and each MTJ memory device has a first static resistance or a second static resistance.

In such embodiments, the array still further includes a plurality of programming lines respectively corresponding to each MTJ memory device for providing a second writing magnetic field and a wiggle magnetic field, wherein a combination of the first writing magnetic field and the second writing magnetic field exceeds a threshold magnetic field required according to the asteroid curve and switches the resistance of the MTJ memory device corresponding to the programming line generating the second writing magnetic field during the data writing procedure. The programming line provides the wiggle magnetic field less than the threshold magnetic field to change the magnetic moment of the free ferromagnetic layer of the MTJ memory device corresponding to the programming line providing the wiggle magnetic field during the data reading procedure. Further included is a sensing circuit for detecting a first signal through the MTJ memory devices without the wiggle magnetic field, detecting a second signal through the MTJ memory devices while applying the wiggle magnetic field, and determining data stored in the MTJ memory device corresponding to the programming line providing the wiggle magnetic field by comparing the first and second currents.

Another embodiment of an MRAM array circuit comprises a data line, a word line for providing a first writing magnetic field, and a bit line across the word line. Also included is a switch having a control gate coupled to the data line, a first terminal coupled to the word line, and a second terminal, wherein the switch is turned ON when it receives a selection signal. A plurality of MTJ memory devices are coupled between the second terminal and the bit line, each MTJ memory device comprising a free ferromagnetic layer, a pinned ferromagnetic layer, and an insulating tunneling barrier located between the pinned ferromagnetic layer and the free ferromagnetic layer, wherein a magnetic moment of the free ferromagnetic layer is freely changeable, a magnetic moment of the pinned ferromagnetic layer is fixed, and each MTJ memory device has a first static resistance or a second static resistance. This embodiment of the array circuit further includes a plurality of programming lines respectively corresponding to each MTJ memory device for providing a second writing magnetic field, wherein a combination of the first writing magnetic field and the second writing magnetic field exceeds a threshold magnetic field and switches the resistance of the MTJ memory device corresponding to the programming line generating the second writing magnetic field during the data writing procedure.

BRIEF DESCRIPTION OF THE DRAWINGS

For a more complete understanding of this disclosure, and the advantages of the systems and methods herein, reference is now made to the following descriptions taken in conjunction with the accompanying drawings, in which.

DETAILED DESCRIPTION

Figure 1:
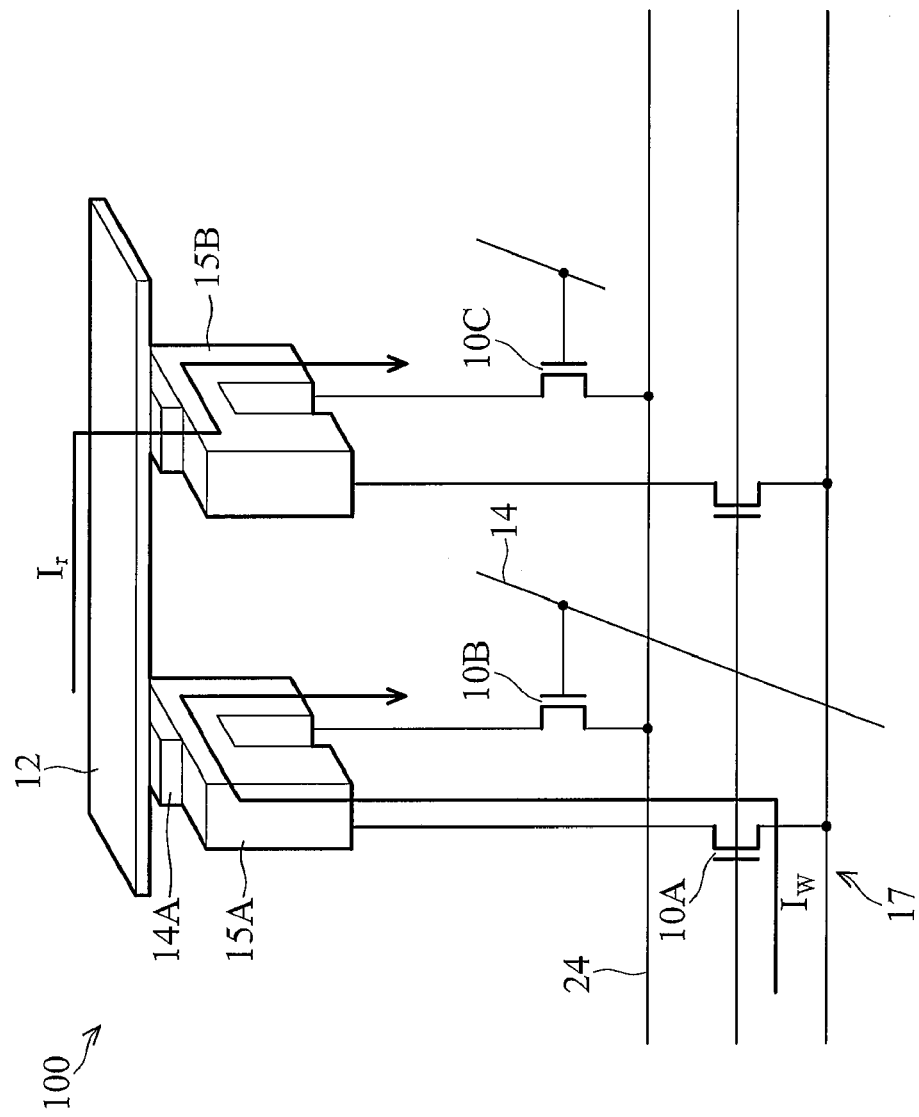
FIG. 1 shows the structure of the 2T1MTJ MRAM array disclosed in Tang.
Figure 2:
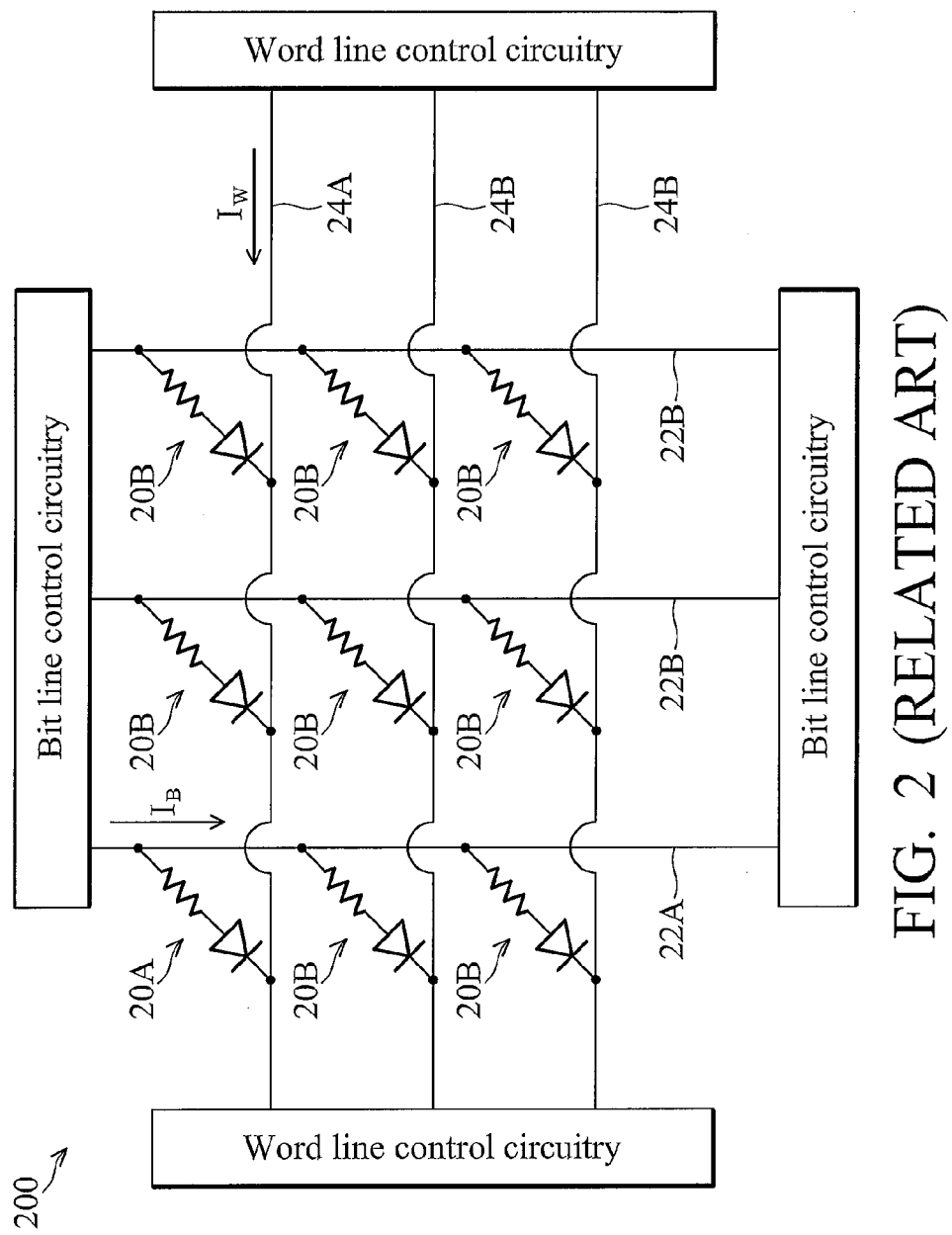
FIG. 2 shows the MRAM circuitry disclosed in Gallagher.
Figure 3:
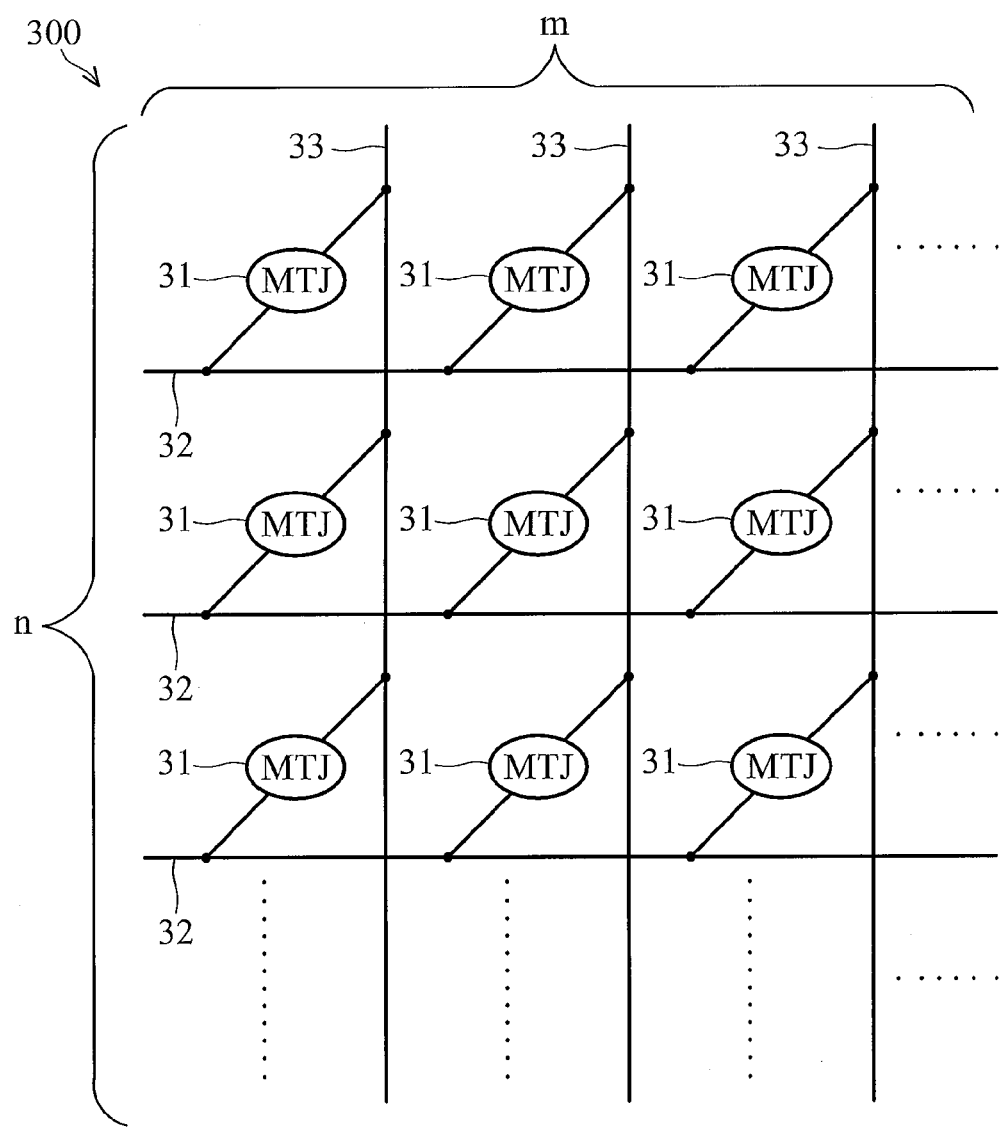
FIG. 3 depicts a cross point array having a plurality of magnetic tunnel junction memory cells, as disclosed in Perner.
Figure 4A:
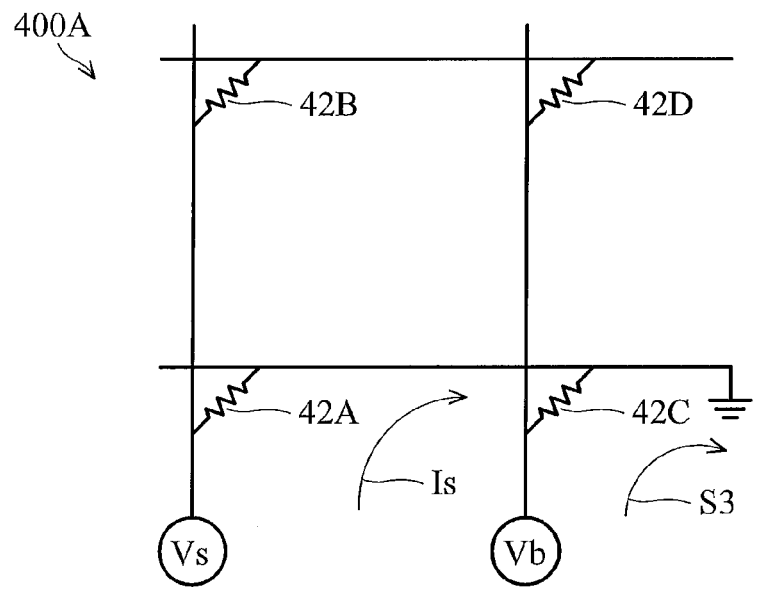
FIGS. 4A and 4B are illustrations of sense and sneak path currents flowing through an electrical equivalent of a resistive cross point array of the Perner device illustrated in FIG. 3.
Figure 4B:
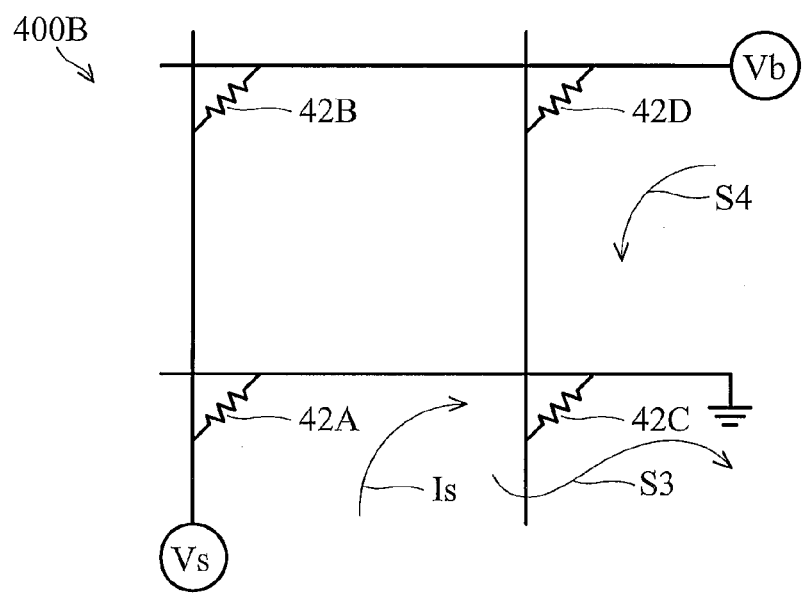
Figure 5:
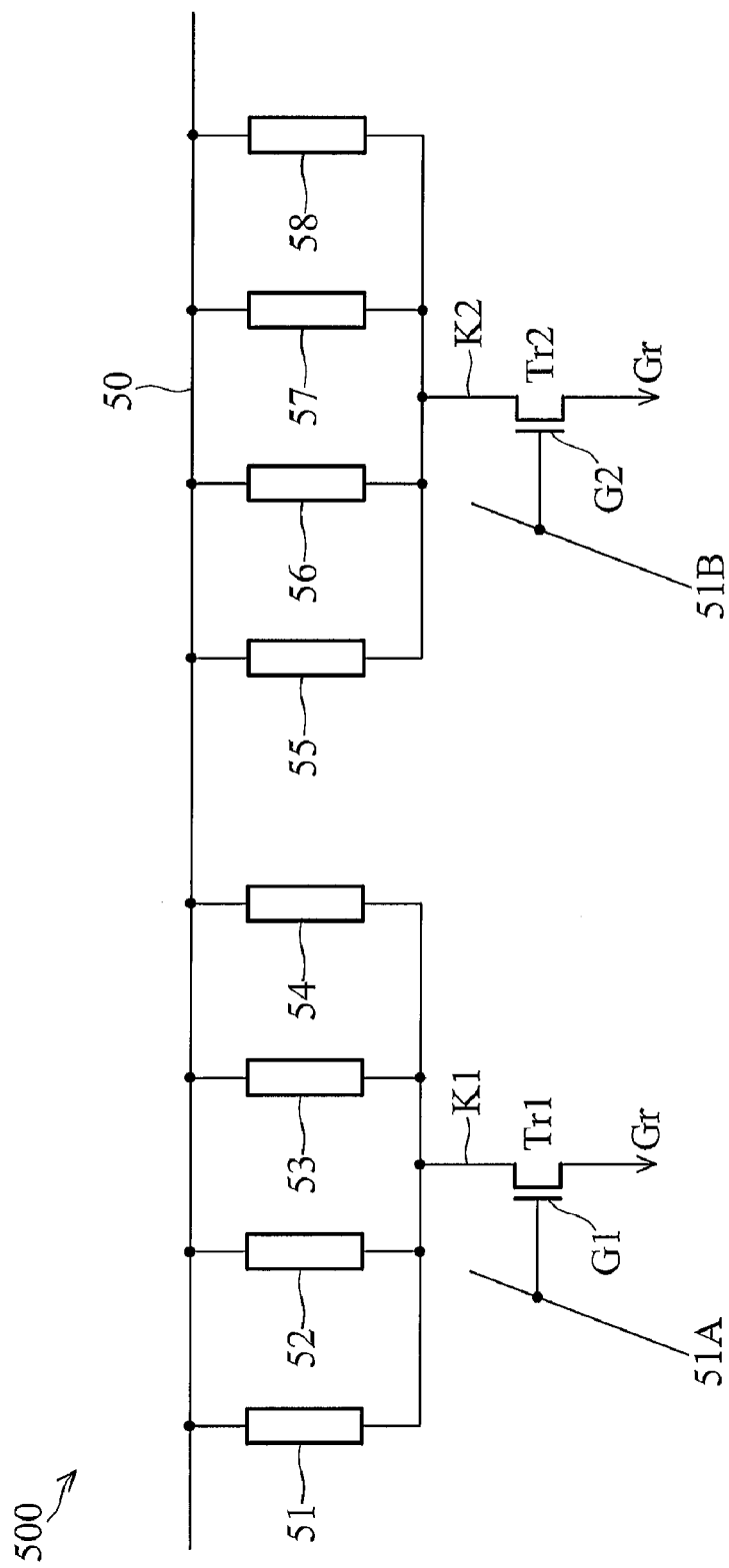
FIG. 5 shows an MRAM configuration disclosed in Gogl.

It is to be understood that the following disclosure provides many different embodiments or examples. Specific examples of components and arrangements are described below to simplify the present disclosure. These are merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Figure 6:
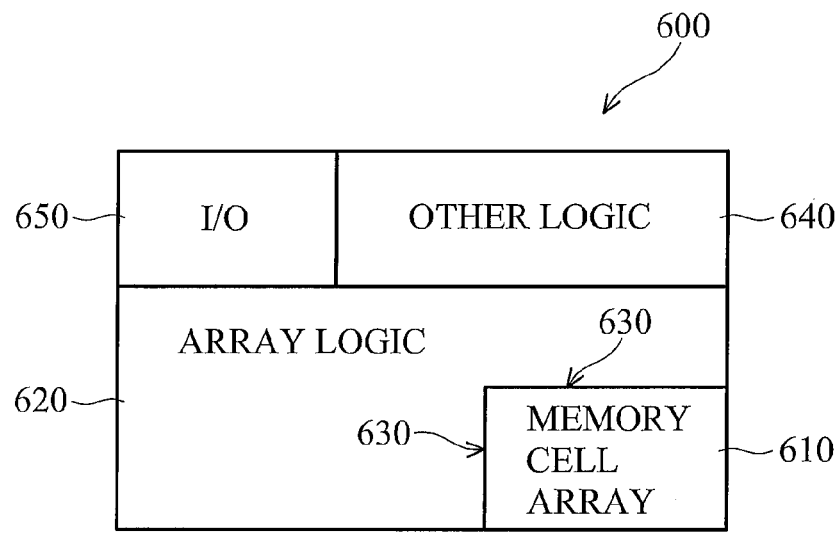
FIG. 6 is a block diagram of one embodiment of an integrated circuit device having a memory cell array according to aspects of the present disclosure.

Referring to FIG. 6, illustrated is a block diagram of one embodiment of an integrated circuit 600 that is one example of a circuit that can benefit from aspects of the present disclosure. The integrated circuit 600 includes a memory cell array 610 that can be controlled by an array logic 620 through an interface 630. It is well known in the art that various logic circuitry, such as row and column decoders and sense amplifiers, can be included in the array logic 620, and that the interface 630 may include one or more bit lines, gate lines, digit lines, control lines, word lines, and other communication paths to interconnect the memory cell array 610 with the array logic 620. These communication paths may hereinafter be referred to as bit lines or word lines, it being understood that different applications of the present disclosure may use different communication paths. The integrated circuit can further include other logic 640 such as counters, clock circuits, and processing circuits, and input/output circuitry 650 such as buffers and drivers.

Figure 7:
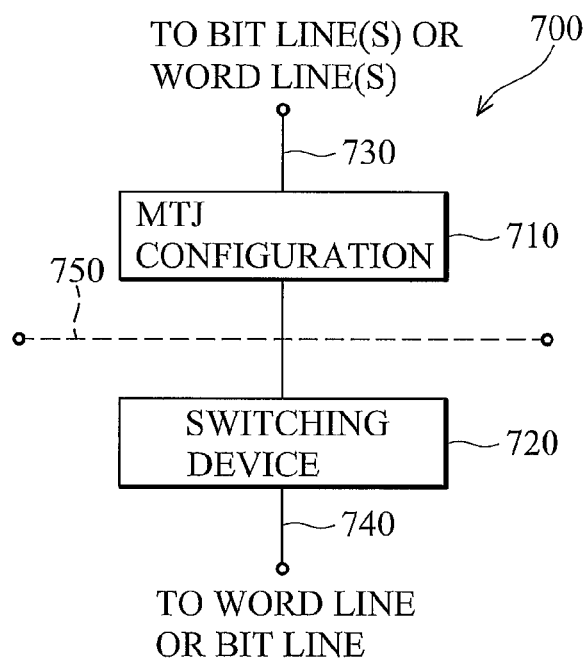
FIG. 7 is a block diagram of one embodiment of a memory cell for use in the memory cell array shown in FIG. 6 according to aspects of the present disclosure.

In FIG. 7, the memory cell array 610 of FIG. 6 may include one or more magnetic random access memory (MRAM) cells 700. Each MRAM cell 700 does not need to be commonly configured, but for the sake of example, can be generically described as including a configuration of one or more MTJ devices 710 and one or more switching devices 720. Examples of various embodiments of the MTJ devices 710 are discussed in further detail below, and examples of the switching device 720 include a metal oxide semiconductor (MOS) transistor, an MOS diode, and/or a bipolar transistor. The memory cell 700 can store 1, 2, 3, 4, or more bits. Also, the present disclosure is applicable and/or readily adaptable to single and double junction MTJ devices with different MR ratios, where there can be four magneto-resistance levels. The different MR ratios may facilitate the capability of sensing at least four levels of magneto-resistance, and the capacity to store at least two bits.

The MRAM cell 700 may include three terminals, a first terminal 730, a second terminal 740, and a third terminal 750. For the sake of example, the first terminal 730 is connected to one or more bit lines and produces an output voltage in a read operation, which is provided to the bit line(s). The second terminal 740 is connected to one or more word lines, which can activate the cell 700 for a read or write operation. The third terminal 750 may be proximate a control line, such as a gate or digit line, and can provide a current for producing a magnetic field to effect the MTJ configuration. It is understood that the arrangement of bit lines, word lines, control lines, and other communication signals can vary for different circuit designs, and the present discussion is only providing one example of such an arrangement.

Figure 8:
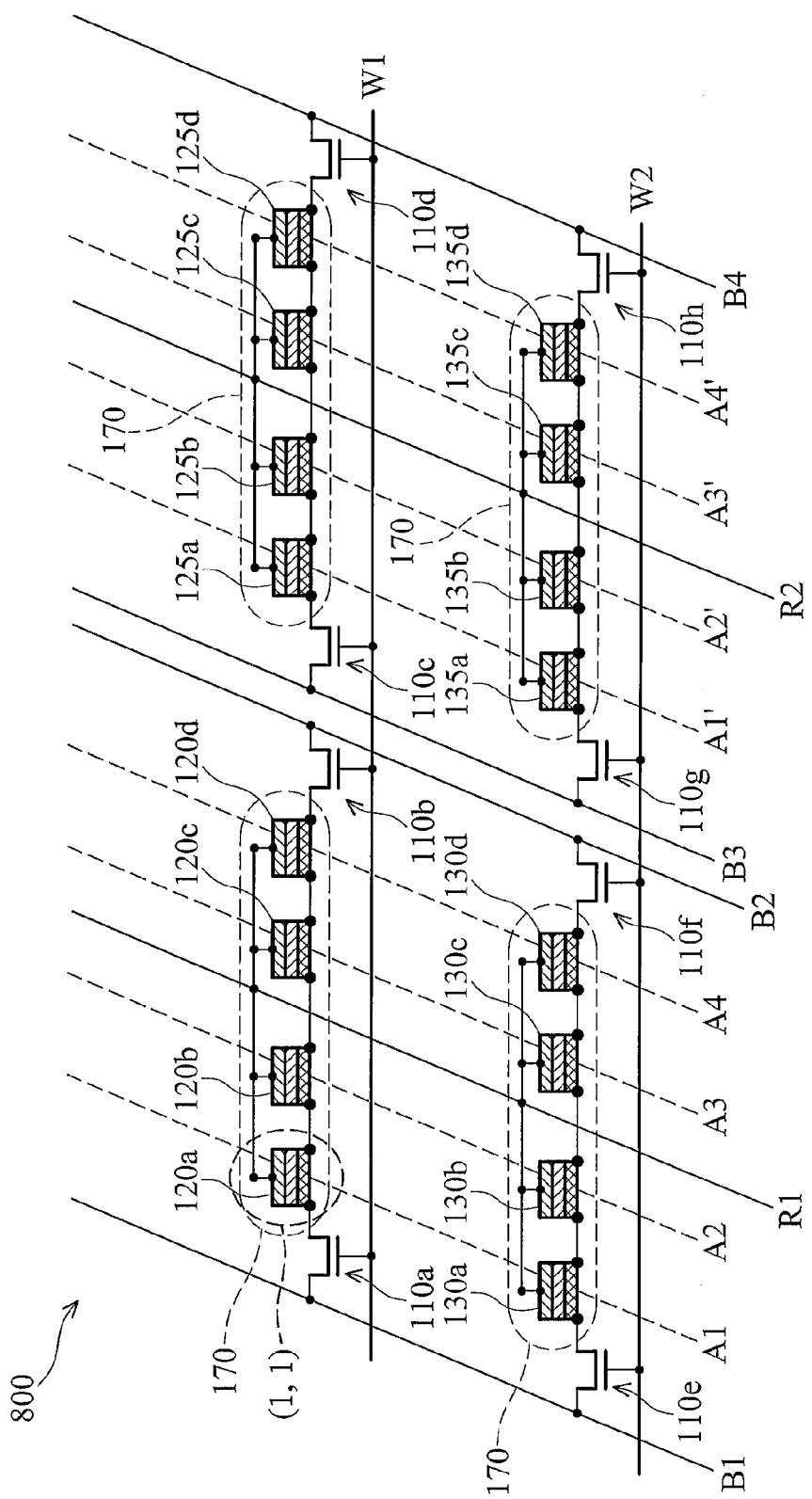
FIG. 8 is a schematic of at least a portion of one embodiment of a memory array according to aspects of the present disclosure.

Referring to FIG. 8, illustrated is a circuit diagram of at least a portion of one embodiment of a memory array 800 according to aspects of the present disclosure. The illustrated portion of the array 800 includes word lines W1, W2, bit lines B1–B4, conductive lines A1–A4 and A1'–A4', read lines R1, R2, switches 110a–110h, and MTJ stacks 120a–120d, 125a–125d, 130a–130d, 135a–135d. Each of the MTJ stacks 120a–120d, 125a–125d, 130a–130d, 135a–135d maybe a portion of a memory cell, such as memory cell (1,1). Of course, the array 800 may comprise many cells in addition to those shown in FIG. 8.

The MTJ stacks 120a–120d, 125a–125d, 130a–130d, 135a–135d may each comprise a free layer located near or adjacent a programming line, a tunneling barrier layer adjacent the free layer, and a pinned layer located adjacent the tunneling barrier layer and distal from the write line. However, in other embodiments, the locations of the free layer and the pinned layer may be switched. The MTJ stack 120a–120d, 125a–125d, 130a–130d, 135a–135d each also have a long axis, which may be referred to as an easy axis, and a short axis, which may be referred to as a hard axis.

The pinned layers may each comprise a ferromagnetic material wherein magnetic dipoles and moments are magnetically "pinned." For example, an adjacent or proximate pinning layer may comprise an anti-ferromagnetic layer or an anti-ferromagnetic exchange layer. In one embodiment, the pinned layers comprise NiFe, NiFeCo, CoFe, Fe, Co, Ni, alloys or compounds thereof, and/or other ferromagnetic materials. The pinned layers may also comprise a plurality of layers. For example, the pinned layers may comprise a Ru spacer layer interposing two or more ferromagnetic layers. Thus, the pinned layers may each be or comprise a synthetic anti-ferromagnetic (SAF) layer. The pinned layers may be formed by chemical-vapor deposition (CVD), plasma-enhanced CVD (PECVD), atomic layer deposition (ALD), physical-vapor deposition (PVD), electrochemical deposition, molecular manipulation, and/or other processes.

The tunneling barriers may comprise SiOx, SiNx, SiOxNy, AlOx, TaOx, TiOx, AlNx and/or other non-conductive materials. In one embodiment, the tunneling barriers may be formed by CVD, PECVD, ALD, PVD, electrochemical deposition, molecular manipulation, and/or other processes. The free layers may be substantially similar in composition and manufacture to the pinned layers. For example, the free layers may comprise NiFe, NiFeCo, CoFe, Fe, Co, Ni, alloys/compounds thereof, and/or other ferromagnetic materials, and may be formed by CVD, PECVD, ALD, PVD, electro-chemical deposition, molecular manipulation, and/or other processes. However, the free layers may not be adjacent an anti ferromagnetic material, such that the free layers may not be magnetically pinned. For example, the magnetic dipoles in the free layers may be aligned in more than one direction. In one embodiment, the free layers each comprise a plurality of layers, such as a Ru spacer layer interposing two or more ferromagnetic layers. Thus, the free layers may each also be or comprise an SAF layer.

The word lines W1, W2, bit lines 131–B4, conductive lines A1–A4 and A1'–A4', read lines R1, R2 may each be an electrically conductive line, possibly including a bulk conductor and a cladding layer. The bulk conductors may be formed by CVD, PECVD, ALD, PVD, electro-chemical deposition, molecular manipulation, and/or other processes, and may comprise Cu, Al, Ag, Au, W, alloys/compounds thereof, and/or other materials. The bulk conductors may also include a barrier layer comprising Ti, Ta, TiN, TaN, WN, SiC, and/or other materials. The cladding layers may be substantially similar in composition and manufacture to the free layers. For example, the cladding layers may comprise NiFe, NiFeCo, CoFe, Fe, Co, Ni, alloys/compounds thereof, and/or other ferromagnetic materials, and may be formed by CVD, PECVD, ALD, PVD, electro-chemical deposition, molecular manipulation, and/or other processes.

When writing to the memory cells, the combined magnetic field in the intersection of selected bit and word lines may be sufficient to change the state of the selected memory cell. For example, in one embodiment of writing to cell (1,1), word line W1 may be selected, a write current W1 is applied to conductive line A1, a write current Iw2 is applied to bit line 131, and other lines may be grounded. To read from an individual memory cell, such as from cell (1,1), word line W1 may be selected, and a read voltage Vr may be applied to read line R1. A basis read current Ir1 may then be sampled from read line R1. The basis read current Ir1 may subsequently held in read line R1 for at least a portion of the read operation. An adjustment current $I_{adj}$ may be activated in conductive line A1, and an adjusted read current Ir2 may be sampled from read line R1. The basis read current Ir1 and the adjusted read current Ir2 may then be compared to determine the logic status of the cell (1,1). The adjustment current $I_{adj}$ may then be deactivated.

Figure 9:
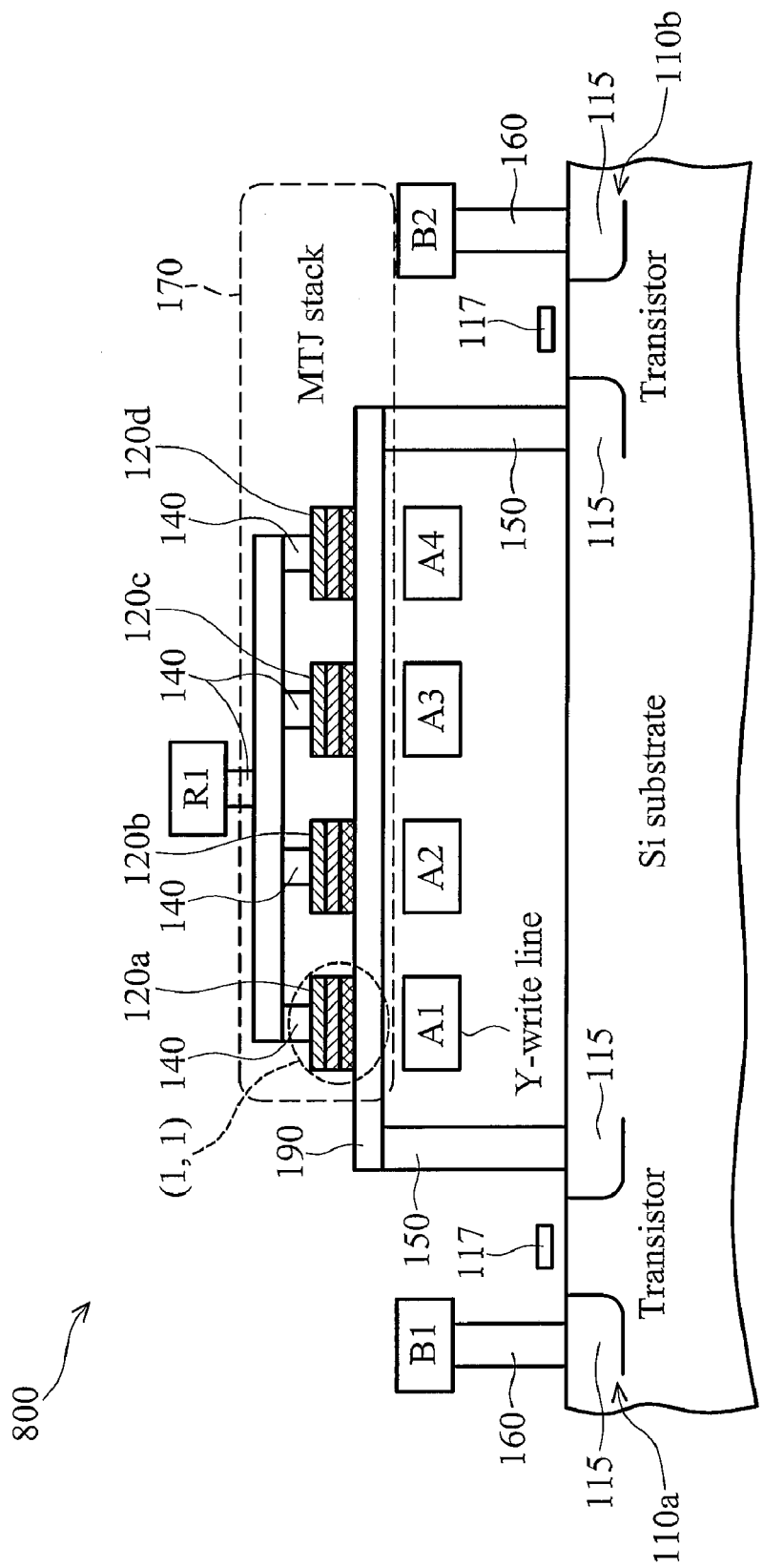
FIG. 9 is a sectional view of a portion of the array shown in FIG. 8.

Referring to FIG. 9, illustrated is a sectional view of at least a portion of one embodiment of the array 800 shown in FIG. 8. The array 800 may include a substrate 105, and one or more of the switches 110a–110h may be formed at least partially within the substrate 105. For example, the portion of the array 800 shown in FIG. 9 includes the switches 110a, 110b, wherein the switches 110a, 110b are depicted as transistors having source/drain regions 115 formed in the substrate 105 and gates 117 over the substrate 105. Although not shown in FIG. 9, the gates 117 may be directly or indirectly connected to the word line W1, as shown in FIG. 8. In some embodiments, diodes may be employed in place of or in addition to transistors for the switches 110a–110h.

The substrate 105 may comprise silicon, gallium arsenide, gallium nitride, strained silicon, silicon germanium, silicon carbide, carbide, diamond, and/or other materials. In one embodiment, the substrate 105 comprises a silicon-on-insulator (SOI) substrate, such as a silicon-on-sapphire substrate, a silicon germanium-on-insulator substrate, or another substrate comprising an epitaxial or otherwise formed semiconductor layer on an insulator layer. The substrate 105 may also or alternatively comprise a fully depleted SOI substrate, possibly having an active layer thickness ranging between about 5 nm and about 200 nm. The substrate 105 may also or alternatively comprise an air gap, such as may be formed in a "silicon-on-nothing" (SON) structure.

The portion of the array 800 shown in FIG. 9 also includes bit lines BI, B2, conductive lines A1–A4, and read line R1. FIG. 9 also more clearly illustrates how a write line X may be employed to program the MTJ stacks 120a–124d, possibly in conjunction with the conductive lines A1–A4. The array 800 may also include interconnects 140 for connecting the MTJ stacks 120a–120d in parallel to the read line R1, interconnects 150 for connecting the write line X to source/drain regions 115 of the switches 110a, 110b, and interconnects 160 for connecting the bit lines B1, B2 to source/drain regions 115 of the switches 110a, 110b, respectively.

The interconnects 140, 150, 160 may extend along and/or through one or more dielectric layers to ones of the switches 110a–110h, bit lines B1–B4, read lines R1, R2, conductive lines A1–A4, A1'–A4', word lines W1, W2, write lines 190, and/or the features of the array 800. For example, interconnects 150, 160 may connect a write line 190 to bit lines B1, B2 via switches 110a, 110b, wherein the write line 190 may be adjacent or proximate MTJ stacks 120a–120d, such that current between bit lines B1, B2 may program MTJ stacks 120a–120d The interconnects 140, 150, 160 may comprise copper, tungsten, gold, aluminum, carbon nano-tubes, carbon fullerenes, refractory metals and/or other materials, and may be formed by CVD, PECVD, ALD, PVD, and/or other processes. The dielectric layers may comprise silicon dioxide, BLACK DIAMOND® (a product of Applied Materials of Santa Clara, Calif.), and/or other materials, and may be formed by CVD, PECVD, ALD, PVD, spin-on coating, and/or other processes.

As described above, in one embodiment of writing to cell (1,1), word line W1 may be selected, thereby turning on transistors 120a, 120b, such that a write current Iw2 applied to bit line B1 may be applied to the write line 190 (bit line B2 may be grounded during this operation). A write current Iw1 may be applied to conductive line A1, and the resultant magnetic field produced by currents in write line 190 and conductive line A1 may be sufficient to program the cell (1,1). Because the conductive lines A1–A4 may be employed in conjunction with the write line 190 to switch the state of the MTJ stacks 120a–120d, the conductive lines A1–A4 may be referred to herein as write lines. The write lines A1–A4 and the write lines 190 may also be referred to as program lines.

Figure 10:
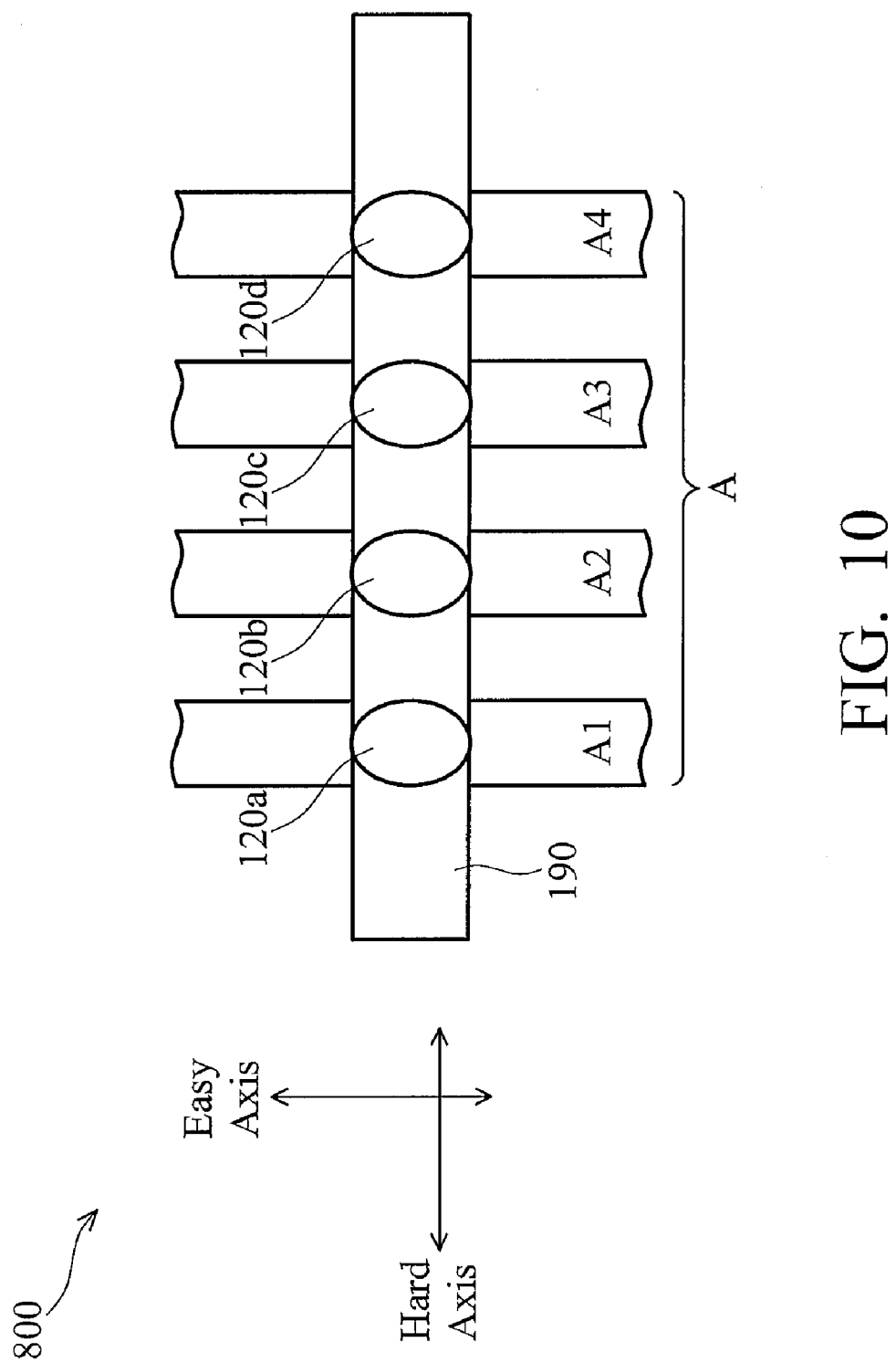
FIG. 10 is a plan view of a portion of the array shown in FIG. 8.

Referring to FIG. 10, illustrated is a plan view of at least portion of the array 800 shown in FIG. 9. The conductive lines A1–A4 may each be substantially perpendicular to the write line 190. The MTJ stacks 120a–120d may also each have a hard axis substantially parallel to the write line 190 and an easy axis substantially parallel to a corresponding one of the conductive lines A1–A4. The MTJ stacks 120a–120d may also be substantially aligned relative to their hard axes, as shown in FIG. 10. The hard axis of an MTJ stack may be the direction that is perpendicular to the moment of pinned layer.

Referring to FIGS. 8–10 collectively, the array 800 may include a number of segment units 170. Each segmented unit 170 may contain a number N of MTJ elements electrically connected in parallel. For example, the segmented unit 170 shown in FIGS. 9 and 10 contains four MTJ stacks 120a–120d (N=4). However, N can be any integer number greater than one within the scope of the present disclosure. When reading, the read current may reflect the parallel resistance of the selected segmented unit 170. As a result, any sneak current paths (like those found in conventional cross point arrays) may be eliminated. Thus, the array 800 shown in FIGS. 8–10 may have a density as high as cross-point arrays while avoiding the detrimental effects of sneak currents.

Figure 11:
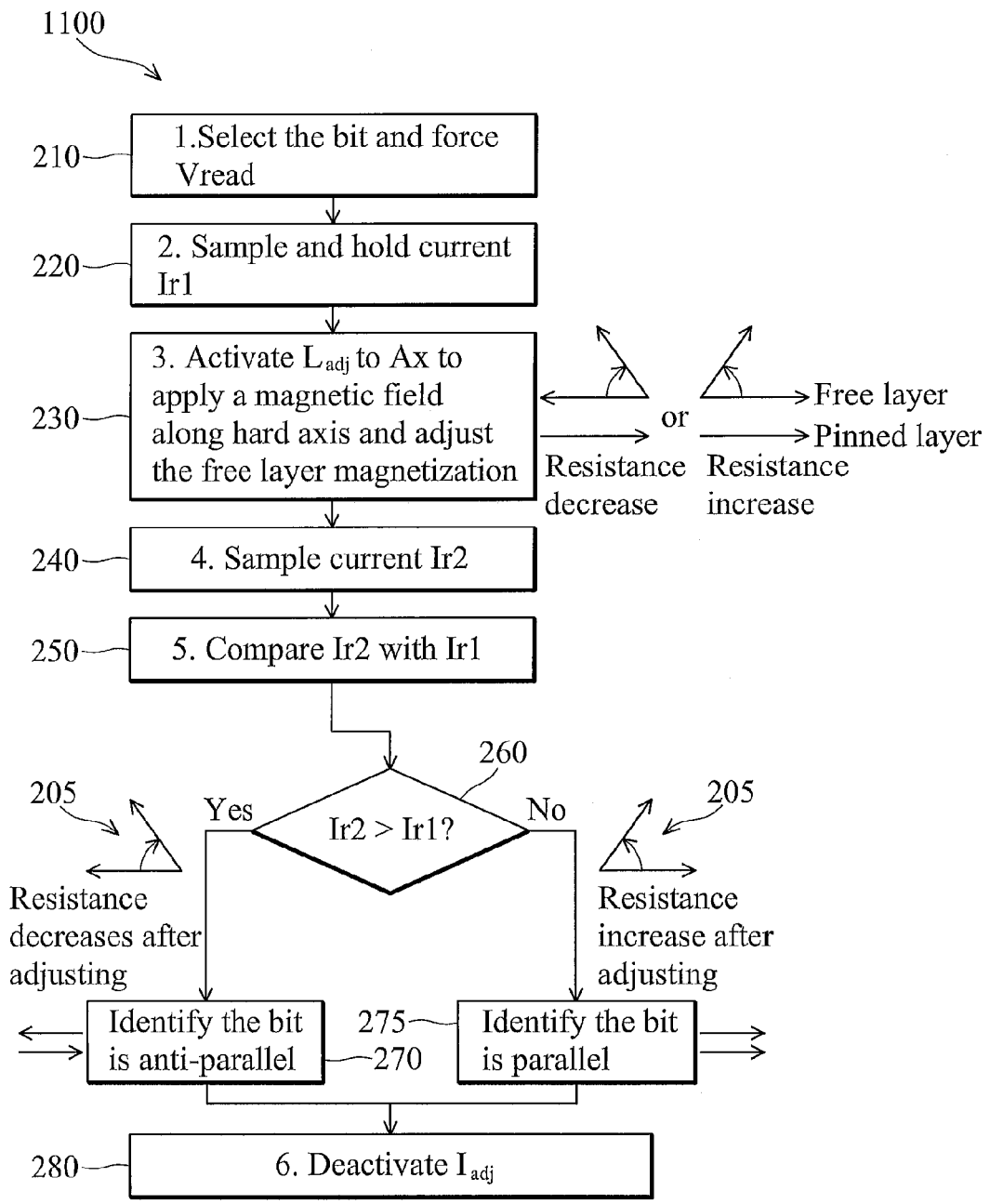
FIG. 11 illustrates a flow-chart diagram of at least a portion of one embodiment of a method of reading a memory cell, such as the memory cell illustrated in FIG. 9.

Referring to FIG. 11, illustrated is a flow-chart diagram of one embodiment of a nondestructive method 1100 of reading memory according to aspects of the present disclosure. The method 1100 includes a step 210 in which a bit or cell is selected, such as by activating one or more word and/or bit lines. The rest of the lines may then be grounded. In a step 220, a read current Ir1 is sensed and held. An adjusting current $I_{adj}$ is applied to a program or write line proximate the cell being read in a step 230, thereby generating a magnetic field along the hard axis of the cell. In a step 240, a current Ir2 is sensed during the period when the adjusting current $I_{adj}$ is applied. The sensed currents Ir1 and Ir2 are compared in a step 250 to identify the state of the cell being read.

The vectors 205 in FIG. 11 demonstrate how the moment of free layer may be adjusted by the magnetic field applied along the hard axis of the cell being read. At the decision step 260, if the second current Ir2 is determined to exceed the first read current Ir1, a magnetization direction of the free ferromagnetic layer has been flipped to be anti-parallel to that of the pinned ferromagnetic layer in the read MTJ memory device by the wiggle current. Thus, the original magnetism direction of the free layer was parallel to the pinned layer, and thus the read MTJ bit was originally parallel, as shown in step 270. If the first read current Ir1 exceeds the second read current Ir2 during application of the wiggle current $I_{adj}$, the magnetization direction of the free ferromagnetic layer was flipped to be parallel to that of the pinned ferromagnetic layer in the read MTJ memory device. Thus, the original magnetism direction of the free layer was anti-parallel to the pinned layer, and thus the read MTJ bit was originally parallel, as shown in step 275. In a step 280, the adjusting current $I_{adj}$ may be deactivated. In one embodiment, the adjusting current $I_{adj}$ may adjust the magnetization of the free layer by an acute angle, possibly by about 45 degrees, without flipping its state.

Figure 12:
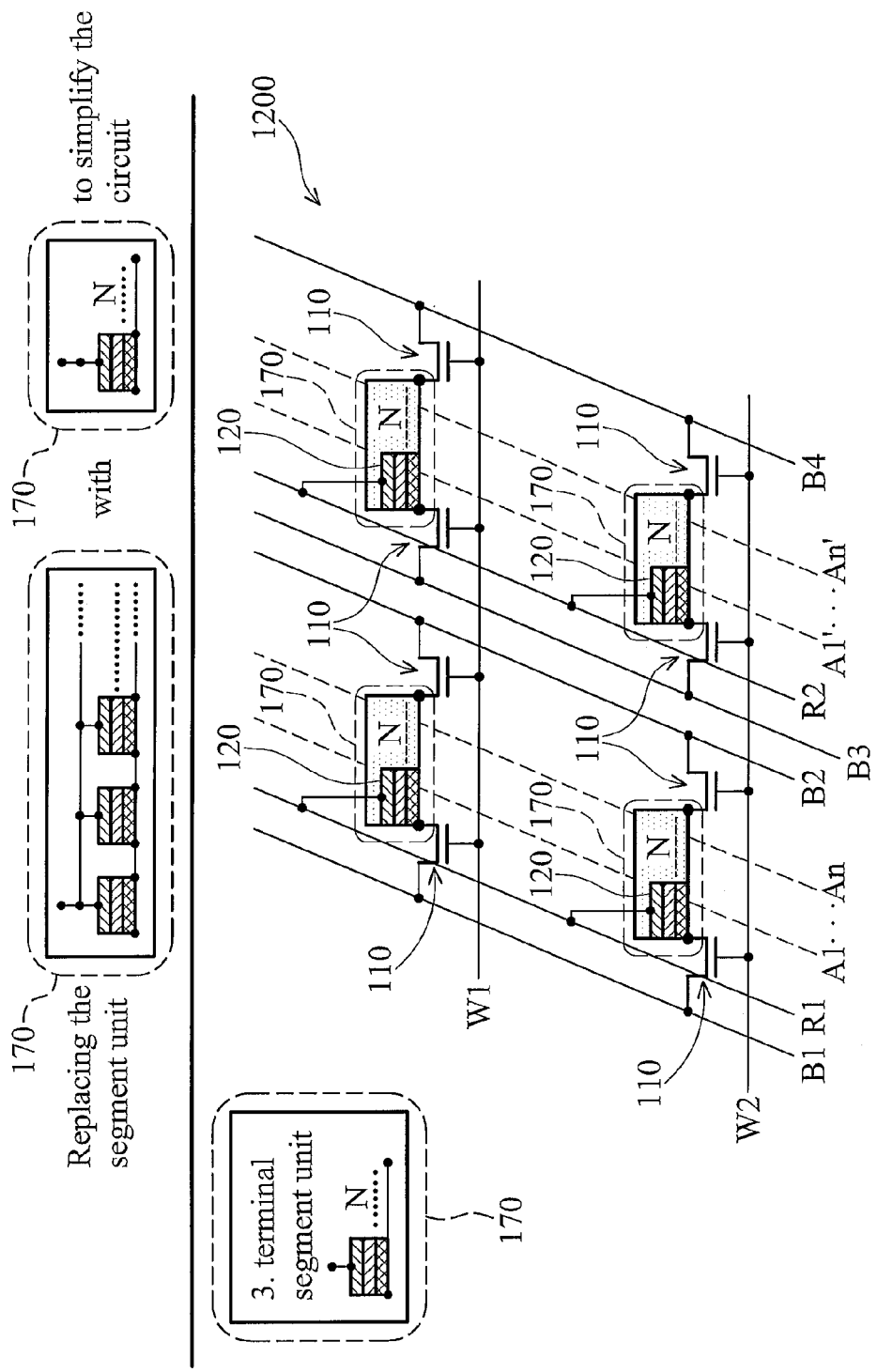
FIG. 12 illustrates another representation of the memory array shown in FIG. 8.

FIG. 12 illustrates another representation of the memory array 800 shown in FIG. 8, herein designated by the reference numeral 1200. The array 1200 shown in FIG. 12 is substantially similar to the array 800 shown in FIG. 8. However, the segmented units 170 shown in FIG. 8 have been redrawn in FIG. 12 in a simplified format. Each of the segmented units 170 includes a number N of MTJ stacks 120 which are connected in parallel to a corresponding one of the read lines R1, R2. The number N may be any integer greater than one.

Each of the MTJ stacks 120 within a segmented unit 170 may be connected in series by a write line, such as write line 190 shown in FIGS. 9 and 10. For example, the write line 190 connecting the MTJ stacks 120 within a segmented unit 170 may be electrically connected to or proximate the pinned layer or the free layer of each of the MTJ stacks 120. Each of the MTJ stacks 120 may also be proximate but electrically isolated from a corresponding one of write lines A1–An, A1'–An', wherein the number of write lines A1–An (i.e., the number "n") is the same as the number N of MTJ stacks 120 in each segmented unit 170. Each segmented unit 170 may be considered a three-terminal unit, wherein one terminal is connected to a corresponding one of the read lines R1, R2, another terminal is connected to a bit line (e.g., B1 or B3) through a switch 110, and another terminal is connected to another bit line (e.g., B2 or B4) through another switch 110. The switches 110 may be or comprise one or more transistors, diodes, and/or devices.

Figure 13:
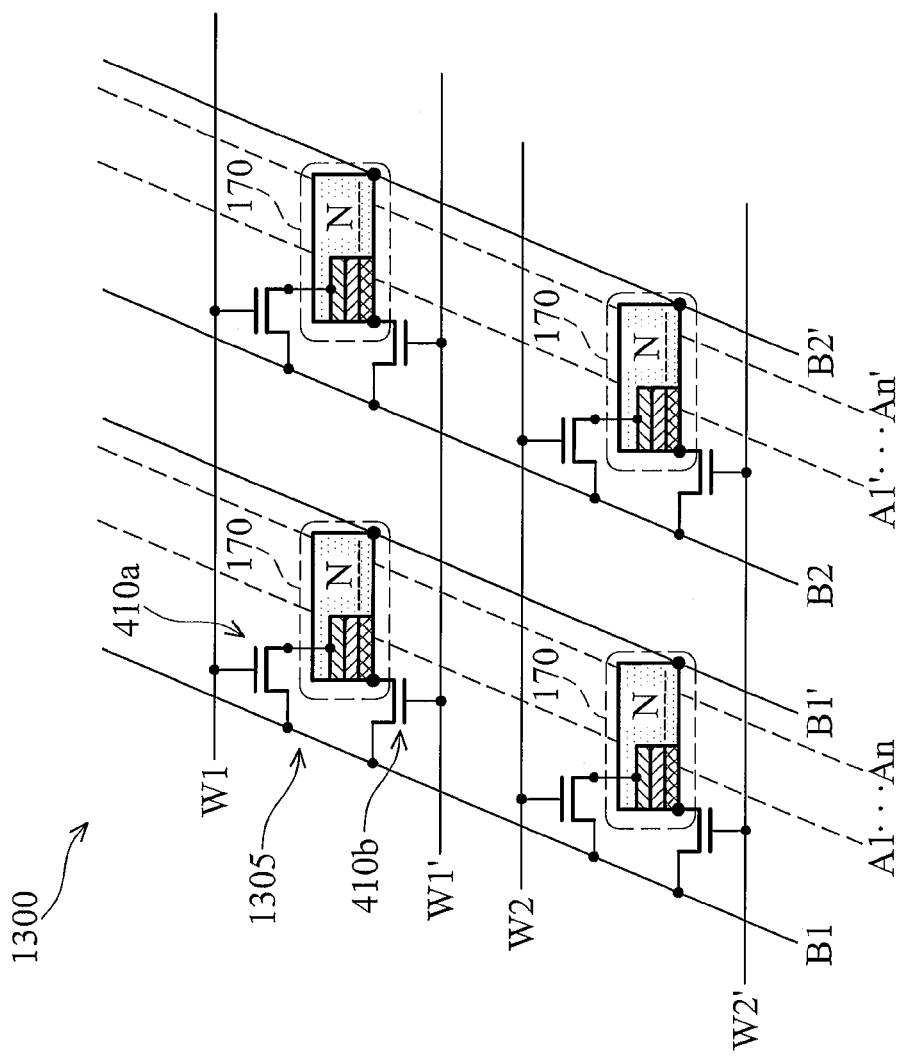
FIG. 13 illustrates a schematic of at least a portion of another embodiment of the memory array 800 shown in FIG. 8.

FIG. 13 illustrates a schematic of at least a portion of another embodiment of the memory array 800 shown in FIG. 8, herein designated by the reference numeral 1300. The array 1300 is substantially similar to the memory array 800. For example, the array 1300 includes bit lines B1, B2, word lines W1, W2, and conductive lines A1–An, A1'–An'. However, the array 1300 also includes bit-bar lines B1', B2' and word-bar lines W1', W2', among others.

The array 1300 also includes segmented units 170 each having a terminal connected to one of a bit line and a bit-bar line through a switch, another terminal connected to the same bit line or bit-bar line through another switch, and another terminal connected to one of another pair of bit/bit-bar lines. For example, a cell 1305 in the array 1300 may include a segmented unit 170 having a terminal connected to bit line B1 through a switch 1310a, wherein the gate of the switch 1310a may be connected to word line W1. Another terminal of the segmented unit 170 in cell 1305 may be connected to bit line B1 through a switch 1310b, wherein the gate of the switch 1310b maybe connected to word-bar line W1'. Another terminal of the segmented unit 170 in cell 1305 may be connected to bit-bar line B1'.

In one embodiment of writing to cell 1305, word-bar line W1' may be selected, and a write current Iw1 may be applied to conductive line A1. An additional write current Iw2 may be applied to bit line B1, and other lines may be grounded. In one embodiment of reading from cell 1305, word line W1 maybe selected, and a read voltage Vr may be applied to bit line B1. Other lines may be grounded. A basis read current Ir1 may then be sensed and held in bit line B1. An adjusting current $I_{adj}$ may then be activated in conductive line A1, and an adjusted read current Ir2 may be sensed in bit line B1.

The read currents Ir1 and Ir2 may then be compared to determine the state of the cell 1305. The adjusting current $I_{adj}$ may then be deactivated.

Figure 14:
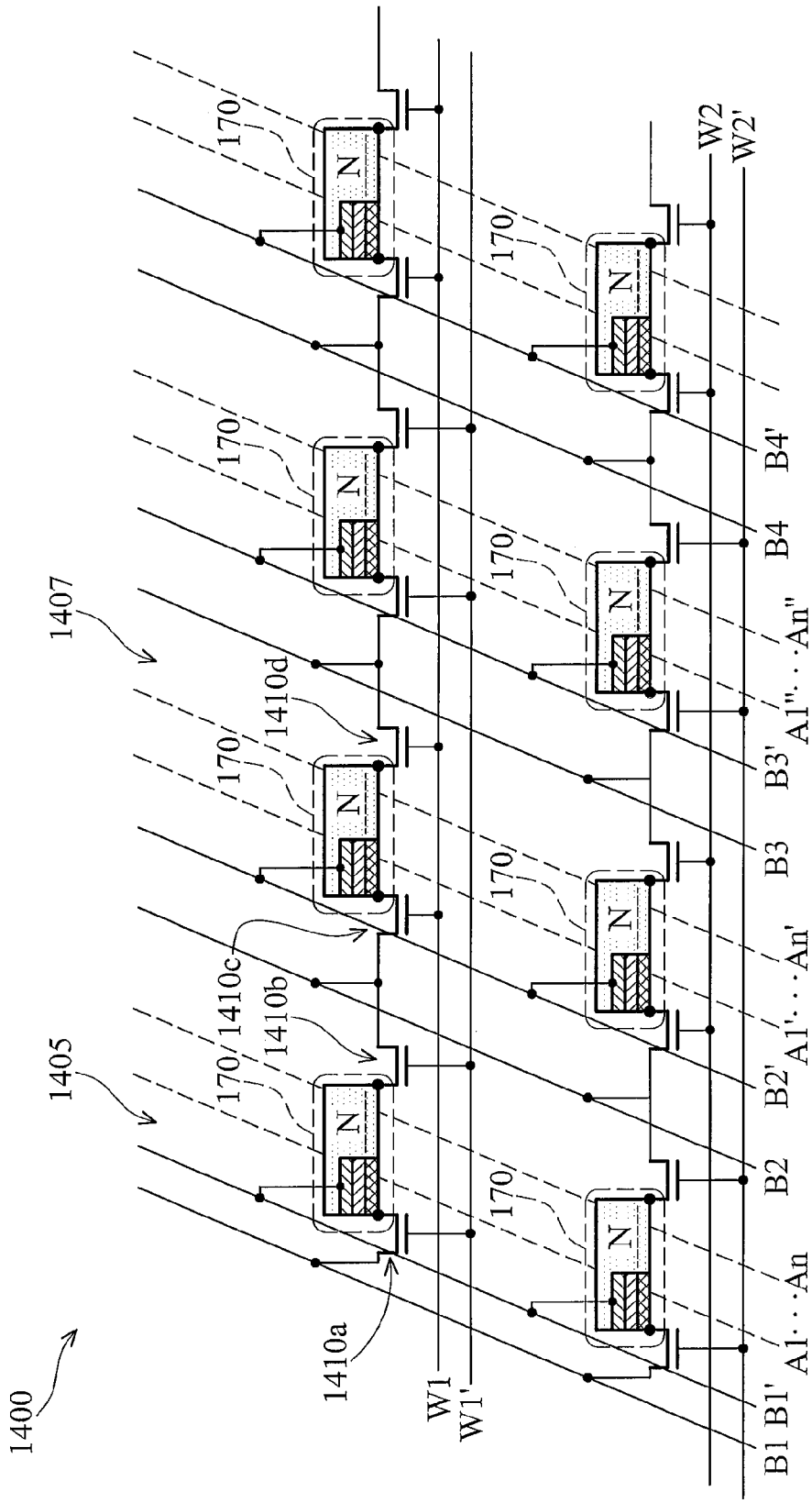
FIG. 14 illustrates a schematic of at least a portion of yet another embodiment of the memory array shown in FIG. 8.

FIG. 14 illustrates a schematic of at least a portion of another embodiment of the memory array 800 shown in FIG. 8, herein designated by the reference numeral 1400. The array 1400 is substantially similar to the memory array 800. For example, the array 1400 includes bit lines B1–B4, word lines W1, W2, and conductive lines A1–An, A1'–An'. However, the array 1400 also includes bit-bar lines B1'–B4', word-bar lines W1', W2', and conductive lines A1"–An", among others.

The array 1400 also includes segmented units 170 each having a terminal connected to one of a bit line and a bit-bar line, another terminal connected to the other of the bit line and the bit-bar line through a switch, and another terminal connected to another bit line or bit-bar line through another switch. For example, a cell 1405 in the array 1400 may include a segmented unit 170 having a terminal connected to bit-bar line B1'. Another terminal of the segmented unit 170 in cell 1405 may be connected to bit line B1 through a switch 1410a, wherein the gate of the switch 1410a may be connected to word-bar line W1'. Another terminal of the segmented unit 170 in cell 1405 may be connected to bit line B2 through another switch 1410b, wherein the gate of the switch 1410b maybe connected to word-bar line W1'. Another cell 1407 in the array 1400 may include a segmented unit 170 having a terminal connected to bit-bar line B2'. Another terminal of the segmented unit 170 in cell 1407 may be connected to bit line B2 through a switch 1410c, wherein the gate of the switch 1410c maybe connected to word line W1. Another terminal of the segmented unit 170 in cell 1407 maybe connected to bit line B3 through another switch 1410d, wherein the gate of the switch 1410d may be connected to word line W1.

In one embodiment of writing to cell 1405, word-bar line W1' may be selected, and a write current Iw1 may be applied to conductive line A1. An additional write current Iw2 may be applied to bit line B1, and other lines may be grounded. In one embodiment of reading from cell 1405, word-bar line W1' may be selected, and a read voltage Vr may be applied to bit-bar line B1'. Other lines may be grounded. A basis read current Ir1 may then be sensed and held in bit-bar line B1'. An adjusting current $I_{adj}$ may then be activated in conductive line A1, and an adjusted read current Ir2 may be sensed in bit-bar line B1'. The read currents Ir1 and Ir2 may then be compared to determine the state of the cell 1405. The adjusting current $I_{adj}$ may then be deactivated.

Figure 15:
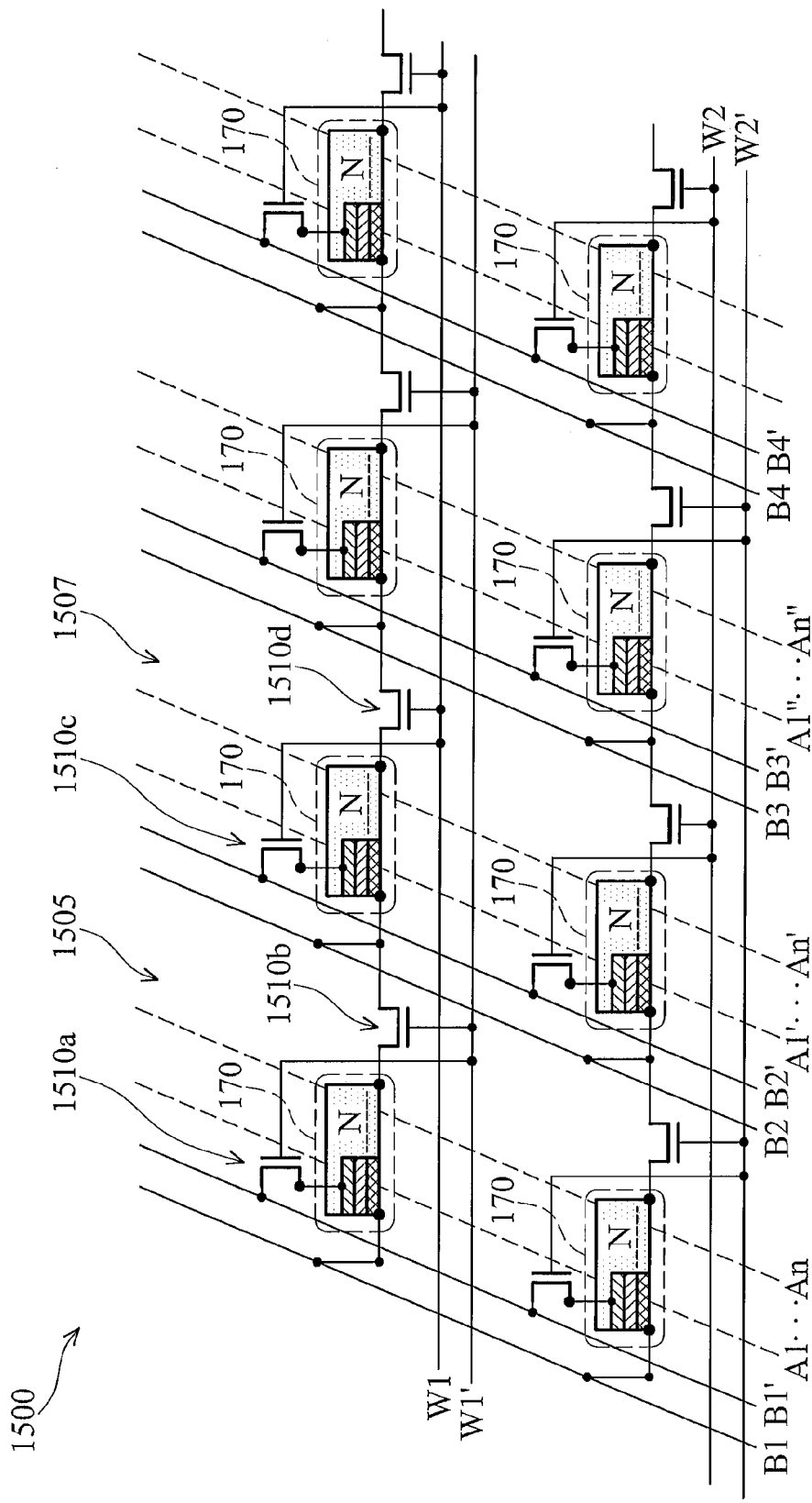
FIG. 15 illustrates a schematic of at least a portion of another embodiment of the memory array shown in FIG. 14.

FIG. 15 illustrates a schematic of at least a portion of another embodiment of the memory array 1400 shown in FIG. 14, herein designated by the reference numeral 1500. The array 1500 is substantially similar to the memory array 1500. For example, the array 1500 includes bit lines B1–B4, B1'–B4', word lines W1, W2, W1', W2', and conductive lines A1–An, A1'–An', A1"–An", among others.

The array 1500 also includes segmented units 170 each having a terminal connected to one of a bit line and a bit-bar line through a switch, another terminal connected to the other of the bit line and the bit-bar line, and another terminal connected to another bit line or bit-bar line through another switch. For example, a cell 1505 in the array 1500 may include a segmented unit 170 having a terminal connected to bit-bar line B1' through a switch 1510a, wherein the gate of the switch 1510a maybe connected to word-bar line W1'. Another terminal of the segmented unit 170 in cell 1505 may be connected to bit line B1. Another terminal of the segmented unit 170 in cell 1505 may be connected to bit line B2 through another switch 1510b, wherein the gate of the switch 1510b may be connected to word-bar line W1'. Another cell 1507 in the array 1500 may include a segmented unit 170 having a terminal connected to bit-bar line B2' through a switch 1510c, wherein the gate of the switch 1510c maybe connected to word line W1. Another terminal of the segmented unit 170 in cell 1507 may be connected to bit line B2. Another terminal of the segmented unit 170 in cell 1507 may be connected to bit line B3 through another switch 1510d, wherein the gate of the switch 1510d may be connected to word line W1.

In one embodiment of writing to cell 1505, word-bar line W1' may be selected, and a write current Iw1 may be applied to conductive line A1. An additional write current Iw2 may be applied to bit line B1, and other lines may be grounded. In one embodiment of reading from cell 1505, word-bar line W1' may be selected, and a read voltage Vr may be applied to bit-bar line B1'. Again, other lines may be grounded. A basis read current Ir1 may then be sensed and held in bit-bar line B1'. An adjusting current $I_{adj}$ may then be activated in conductive line A1, and an adjusted read current Ir2 may be sensed in bit-bar line B1'. The read currents Ir1 and Ir2 may then be compared to determine the state of the cell 1505. The adjusting current $I_{adj}$ may then be deactivated.

Figure 16:
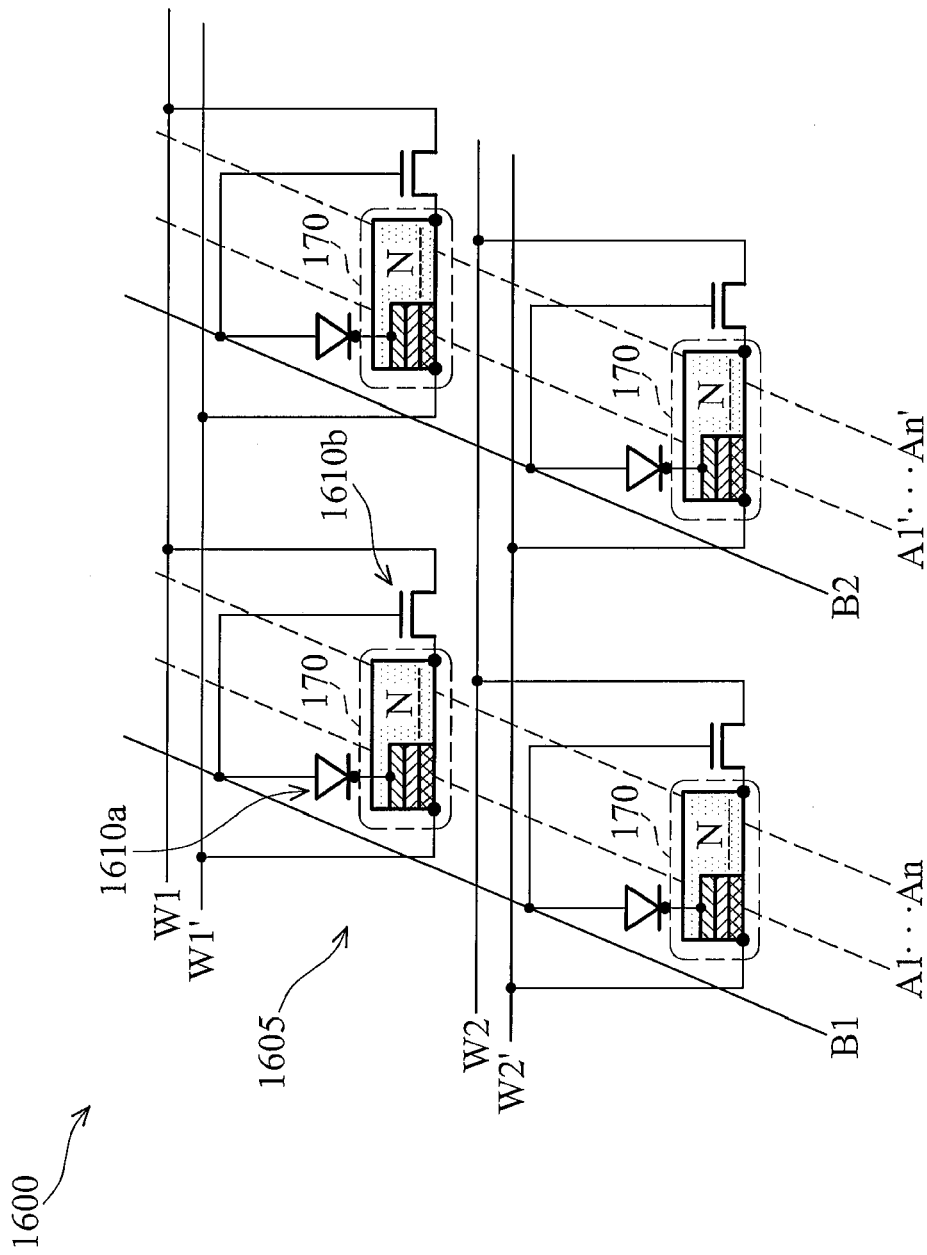
FIG. 16 illustrates a schematic of at least a portion of yet another embodiment of the memory array shown in FIG. 14.

FIG. 16 illustrates a schematic of at least a portion of another embodiment of the memory array 1400 shown in FIG. 14, herein designated by the reference numeral 1600. The array 1600 is substantially similar to the memory array 1400. For example, the array 1600 includes bit lines B1, B2, word lines W1, W2, W1', W2', and conductive lines A1–An, A1'–An' among others.

The array 1600 also includes segmented units 170 each having a terminal connected to bit line through a switch, another terminal connected to one of a word line and a word-bar line, and another terminal connected to the other of the word line and word-bar line through another switch. However, several of the switches in the array 1600 may be diodes instead of (or in addition to) transistors. For example, a cell 1605 in the array 1600 may include a segmented unit 170 having a terminal connected to bit line B1 through a switch 1610a, wherein the switch 1610a may be or comprise a diode. Another terminal of the segmented unit 170 in cell 1605 may be connected to word-bar line W1'. Another terminal of the segmented unit 170 in cell 1605 may be connected to word line W1 through another switch 1610b, wherein the switch 1610b is a transistor having a gate that may be connected to bit line B1.

In one embodiment of writing to cell 1605, bit line B1 may be selected, and a write current Iw1 may be applied to conductive line A1. An additional write current Iw2 may be applied to word line W1, and other lines may be grounded. In one embodiment of reading from cell 1605, word lines W1, W1' may be grounded, and all other word lines may be raised to a voltage Vdd. A read voltage Vr may be applied to bit line B1, and other lines may be grounded. A basis read current Ir1 may then be sensed and held in bit line B1. An adjusting current $I_{adj}$ may then be activated in conductive line A1, and an adjusted read current Ir2 may be sensed in bit line B1. The read currents Ir1 and Ir2 may then be compared to determine the state of the cell 1605. The adjusting current $I_{adj}$ may then be deactivated.

Figure 17:
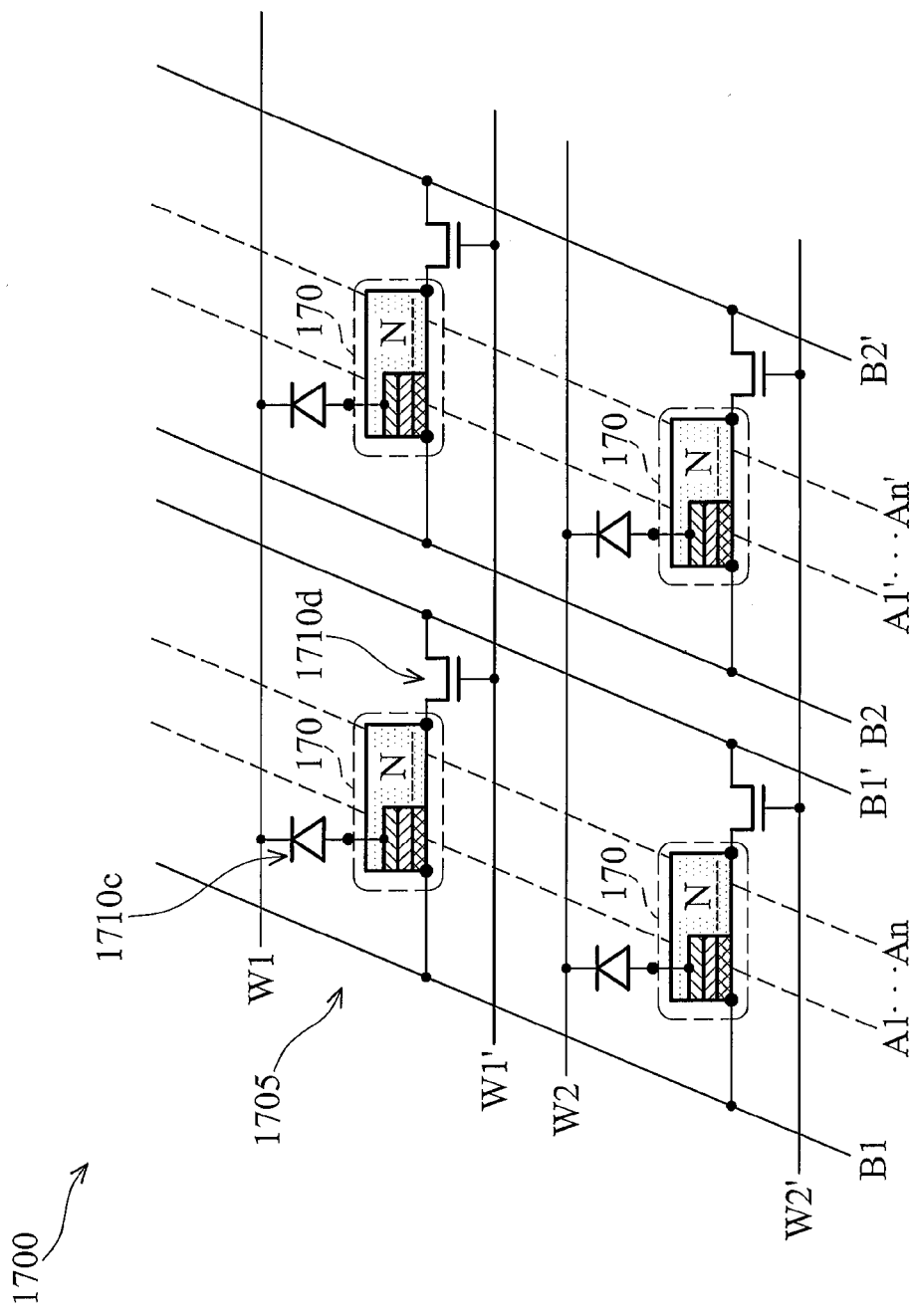
FIG. 17 illustrates a schematic of at least a portion of another embodiment of the memory array shown in FIG. 16.

FIG. 17 illustrates a schematic of at least a portion of another embodiment of the memory array 1600 shown in FIG. 16, herein designated by the reference numeral 1700. The array 1700 is substantially similar to the memory array 1600. For example, the array 1700 includes bit lines B1, B2, word lines W1, W2, W1', W2', and conductive lines A1–An, A1'–An', among others. The array 1700 also includes segmented units 170 each having a terminal connected to one of a word line and a word-bar line through a switch, another terminal connected to one of a bit line and a bit-bar line, and another terminal connected to the other of the bit line and bit-bar line through another switch. Several of the switches in the array 1700 may be diodes instead of (or in addition to) transistors.

For example, a cell 1705 in the array 1700 may include a segmented unit 170 having a terminal connected to word line W1 through a switch 1710c, wherein the switch 1710c may be or comprise a diode. Another terminal of the segmented unit 170 in cell 1705 may be connected to bit line B1. Another terminal of the segmented unit 170 in cell 1705 may be connected to bit-bar line B1' through another switch 1710d, wherein the switch 1710d may be a transistor having a gate that may be connected to word-bar line W1'.

In one embodiment of writing to cell 1705, bit line B1 may be selected, and a write current Iw1 may be applied to conductive line A1. An additional write current Iw2 may be applied to word line W1, and other lines may be grounded. In one embodiment of reading from cell 1705, all word-bar lines (W1', W2', etc.) may be grounded, and all other word lines (W1, W2, etc) may be raised to a voltage Vdd. A read voltage Vr may be applied to bit line B1, and other lines may be grounded, including word line W1. A basis read current Ir1 may then be sensed and held in bit line B1. An adjusting current $I_{adj}$ may then be activated in conductive line A1, and an adjusted read current Ir2 may be sensed in bit line B1. The read currents Ir1 and Ir2 may then be compared to determine the state of the cell 1705. The adjusting current $I_{adj}$ may then be deactivated.

Figure 18:
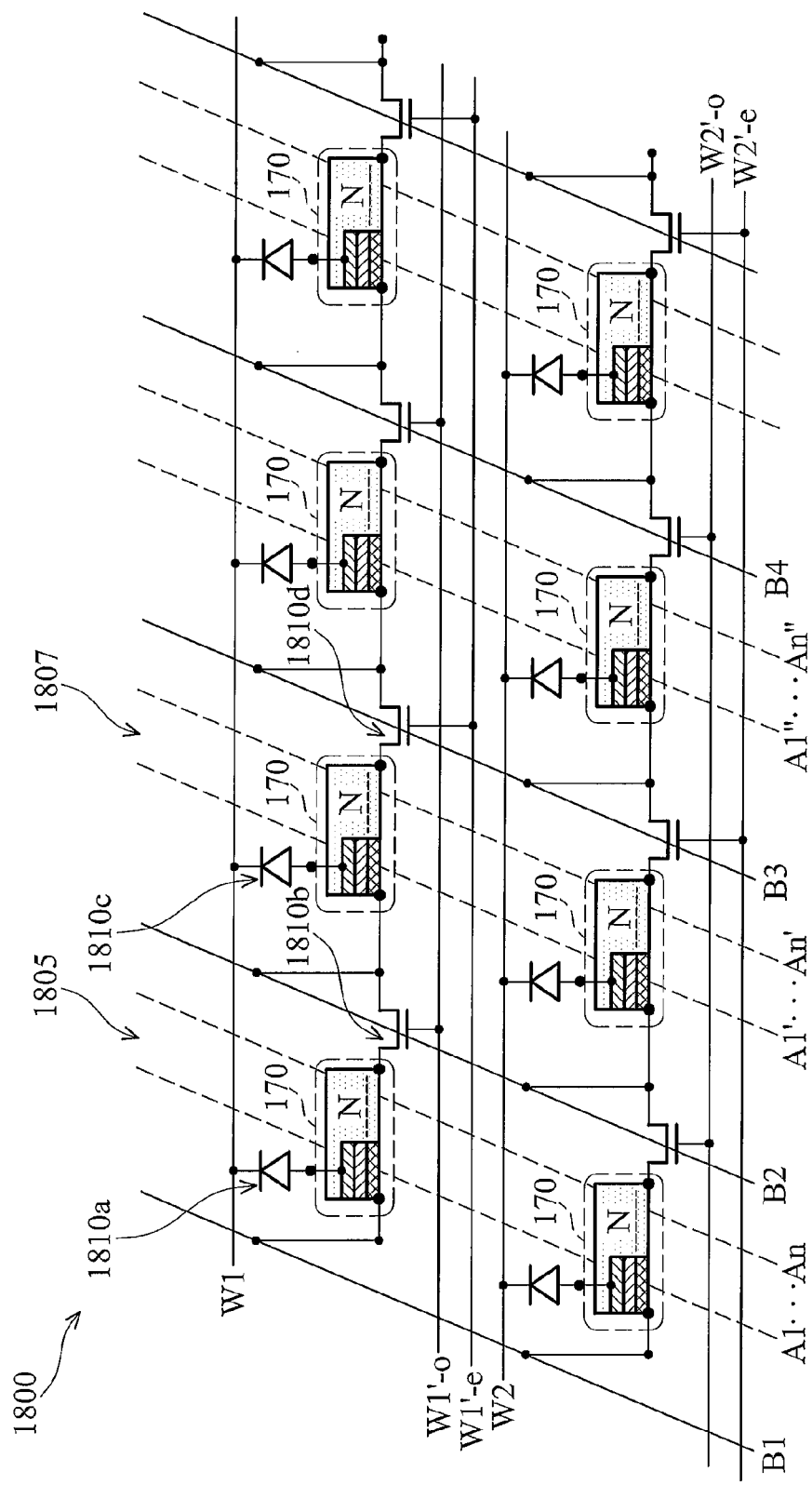
FIG. 18 illustrates a schematic of at least a portion of another embodiment of the memory array shown in FIG. 17.

FIG. 18 illustrates a schematic of at least a portion of another embodiment of the memory array 1700 shown in FIG. 17, herein designated by the reference numeral 1800. The array 1800 is substantially similar to the memory array 750. For example, the array 1800 includes bit lines B1, B2, word lines W1, W2, and conductive lines A1–An, A1'–An'. However, the array 1800 also includes bit lines B3, B4, word-bar lines W1'-o, W1'-e, W2'-o, W2'-e, conductive lines A1"–An", among others. Thus, for each word line (e.g., W1), the array 1800 may comprise two word-bar lines (e.g., W1'-o, W1'-e). For example, word-bar line W1'-o may be employed with odd-numbered ones of the cells which also employ word line W1, and word-bar line W1'-e may be employed with even-numbered ones of the cells that also employ word line W1. However, the cells that employ a word line may not be evenly distributed between corresponding word-bar lines, such that the even distribution (e.g., 50% of each) depicted in FIG. 18 may not be required. Moreover, more than two word-bar lines (e.g., W1'-1, W1'-2, W1'-3) may be employed with each corresponding word line.

The array 1800 also includes segmented units 170 each having a terminal connected to one of a word line and a word-bar line through a switch, another terminal connected to a bit line, and another terminal connected to another bit line through another switch. Several of the switches in the array 1800 may be diodes instead of (or in addition to) transistors.

For example, a cell 1805 in the array 1800 may include a segmented unit 170 having a terminal connected to word line W1 through a switch 1810a, wherein the switch 1810a may be or comprise a diode. Another terminal of the segmented unit 170 in cell 1805 may be connected to bit line B1, and another terminal of the segmented unit 170 in cell 1805 may be connected to bit line B2 through another switch 1810b, wherein the switch 1810b may be a transistor having a gate that may be connected to word-bar line W1'-o. Another cell 1807 in the array 1800 may include a segmented unit 170 having a terminal connected to word line W1 through a switch 1810c, wherein the switch 1810c may be or comprise a diode. Another terminal of the segmented unit 170 in cell 1807 may be connected to bit line B2. Another terminal of the segmented unit 170 in cell 1807 may be connected to bit line B3 through another switch 1810d, wherein the switch 1810d may be a transistor having; a gate that may be connected to word-bar line W1'-e.

In one embodiment of writing to cell 1805, bit line B1 may be selected, and a write current Iw1 may be applied to conductive line A1. An additional write current Iw2 may be applied to word line W1, and other lines may be grounded. In one embodiment of reading from cell 1805, all word-bar lines (W1'-o, W1'-e, 2'o, W2'-e, etc.) may be grounded, and all other word lines (W1, W2, etc) may be raised to a voltage Vdd. A read voltage Vr may be applied to bit line B1, and other lines may be grounded, including word line W1. A basis read current Ir1 may then be sensed and held in bit line B1. An adjusting current $I_{adj}$ may then be activated in conductive line A1, and an adjusted read current Ir2 may be sensed in bit line B1. The read currents Ir1 and Ir2 may then be compared to determine the state of the cell 1805. The adjusting current $I_{adj}$ may then be deactivated.

Figure 19:
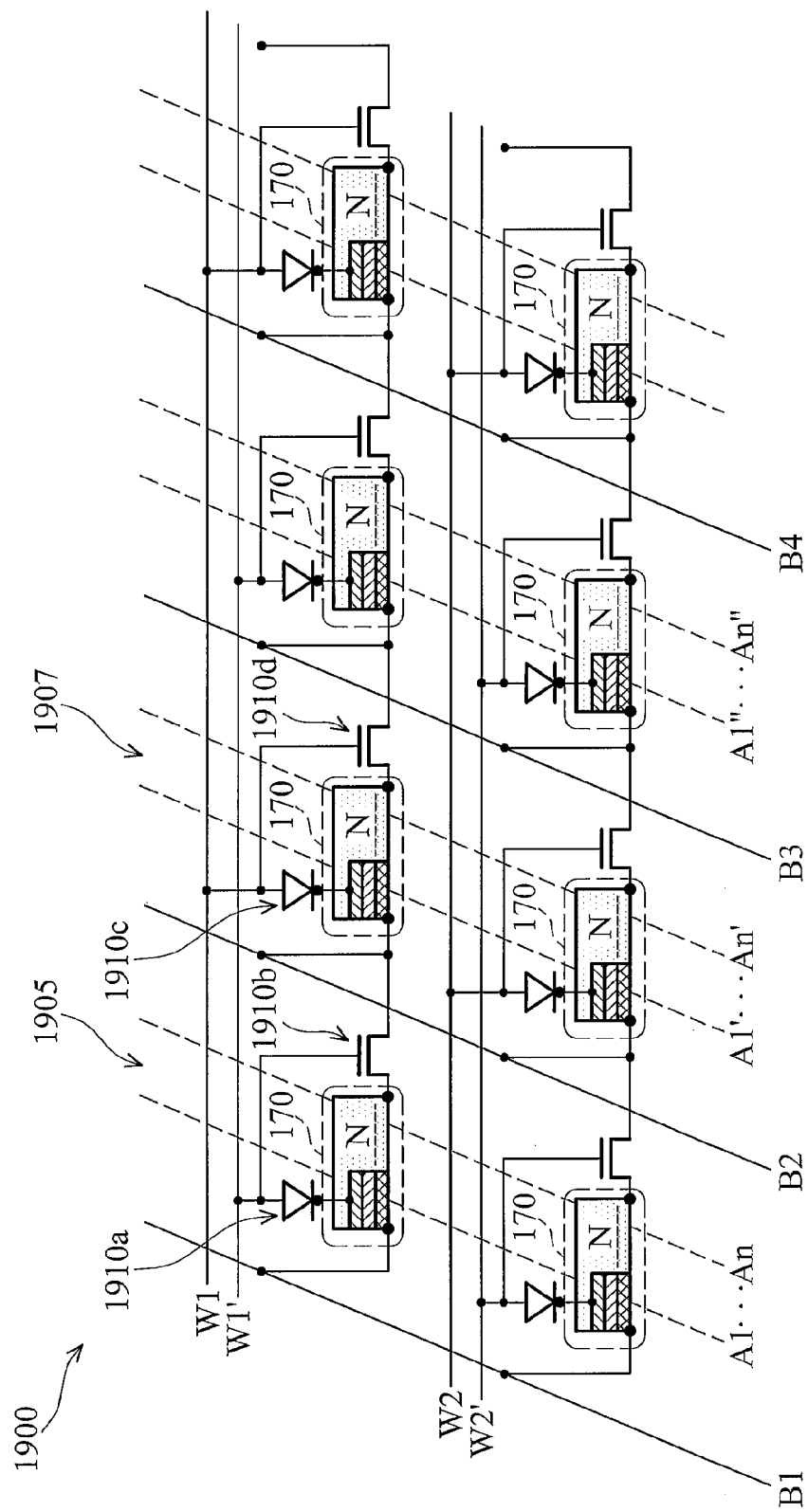
FIG. 19 illustrates a schematic of at least a portion of yet another embodiment of the memory array shown in FIG. 17.

FIG. 19 illustrates a schematic of at least a portion of another embodiment of the memory array 1700 shown in FIG. 17, herein designated by the reference numeral 900. The array 1900 is substantially similar to the memory array 1700. For example, the array 1900 includes bit lines B1, B2, word lines W1, W1', W2, W2', and conductive lines A1–An, A1'–An'. However, the array 1900 also includes bit lines B3, B4 and conductive lines A1"–An", among others.

The array 1900 also includes segmented units 170 each having a terminal connected to one of a word line and a word-bar line through a switch, another terminal connected to a bit line, and another terminal connected to another bit line through another switch. Several of the switches in the array 1900 may be diodes instead of (or in addition to) transistors. Portions of several of the switches in the array 1900 may also be connected.

For example, a cell 1905 in the array 1900 may include a segmented unit 170 having a terminal connected to word-bar line W1' through a switch 1910a, wherein the switch 1910a may be or comprise a diode. Another terminal of the segmented unit 170 in cell 1905 may be connected to bit line B1. Another terminal of the segmented unit 170 in cell 1905 may be connected to bit line B2 through another switch 1910b, wherein the switch 1910b may be a transistor having a gate that may be connected to the switch 1910a opposite the MTJ stacks of the segmented unit 170. Another cell 1907 in the array 1900 may include a segmented unit 170 having a terminal connected to word line W1 through a switch 1910c, wherein the switch 1910c may be or comprise a diode. Another terminal of the segmented unit 170 in cell 1907 may be connected to bit line B2. Another terminal of the segmented unit 170 in cell 1907 may be connected to bit line B3 through another switch 1910d, wherein the switch 1910d may be a transistor having a gate that may be connected to the switch 1910c opposite the MTJ stacks of the segmented unit 170.

In one embodiment of writing to cell 1905, word-bar line W1' may be selected, and a write current Iw1 may be applied to conductive line A1. An additional write current Iw2 may be applied to bit line B1, and other lines may be grounded. In one embodiment of reading from cell 1905, bit lines B1 and/or B2 may be grounded, and all other bit lines may be raised to a voltage Vdd. A read voltage Vr may be applied to word-bar line W1', and other word and/or word-bar lines may be grounded. A basis read current Ir1 may then be sensed and held in word-bar line W1'. An adjusting or wiggle current $I_{adj}$ may then be activated in conductive line A1, and an adjusted read current Ir2 may be sensed in word-bar line W1'. The read currents Ir1 and Ir2 may then be compared to determine the state of the cell 1905. The adjusting current $I_{adj}$ may then be deactivated.

Thus, the above embodiments provide various MRAM arrays including, among other elements, a plurality of segment units and a plurality of conductive lines. Each of the plurality of segment units includes a number N of MTJ cells electrically connected in parallel, wherein N is an integer greater than one. Each of the MTJ cells has a hard axis that may be oriented substantially parallel to a direction in which the N MTJ cells are aligned. The plurality of conductive lines are each electrically isolated from a corresponding one, more, or all of the NMTJ cells, and have a long direction or axis substantially perpendicular to the hard axis of the N MTJ cells. Such embodiments of MRAM arrays can include a plurality of segment units that, in addition to the above-described MTJ cells, include two switches electrically connected to the MTJ cell. One or both of the switches may be a transistor and/or a diode. However, in the following embodiments, the disclosed MRAM arrays employ only one switching device for a plurality of MTJ cells.

Figure 20:
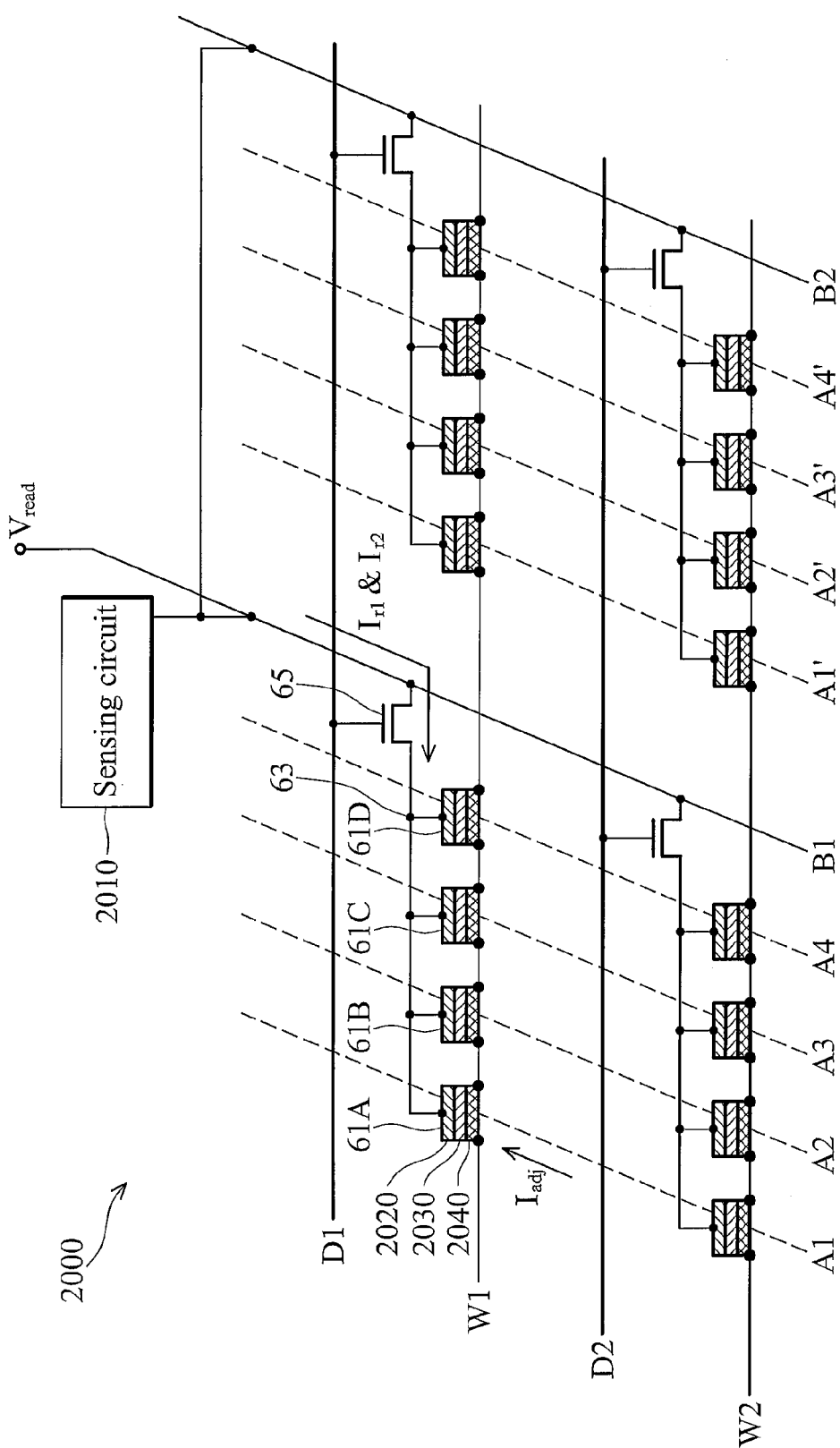
FIG. 20 illustrates a schematic circuit diagram illustrative of one memory array circuit of MTJ memory devices according to a first embodiment of a single switch arrangement disclosed herein.

FIG. 20 illustrates a schematic circuit diagram illustrative of one memory array 2000 of MTJ memory devices according to a first embodiment of the invention. The MRAM array 2000 comprises data lines D1 and D2, bit lines B1 and B2, and word lines W1 and W2. MTJ memory devices 61A, 61B, 61C, and 61D are connected in parallel between node 63 and word line W1. Each MTJ memory device comprises a free ferromagnetic layer 2020, a pinned ferromagnetic layer 2040, and an insulating tunneling barrier 2030 located between the pinned ferromagnetic layer 2040 and the free ferromagnetic layer 2020. The free ferromagnetic layer 2020 has a freely changeable magnetic moment, the pinned ferromagnetic layer 2040 has a fixed magnetic moment, and the insulating tunneling barrier 2030 is a very thin insulation layer.

The NMOS transistor of switch 65, for example, is connected between bit line B1 and the node 63, and controlled by a selection signal provided by data line D1. In the exemplary embodiment of FIG. 20, the four MTJ memory devices 61A to 61D are each allocated to the node 63. Instead of four MTJ memory devices, two or three memory devices, or more than four memory devices, can also be assigned to one node. Programming lines A1, A2, A3, and A4 are located near the corresponding MTJ memory devices 61A, 61B, 61C, and 61D, respectively. In addition, a sensing circuit 2010 detects the current flowing through bit lines B1 and B2 when performing a read operation.

Figure 21:
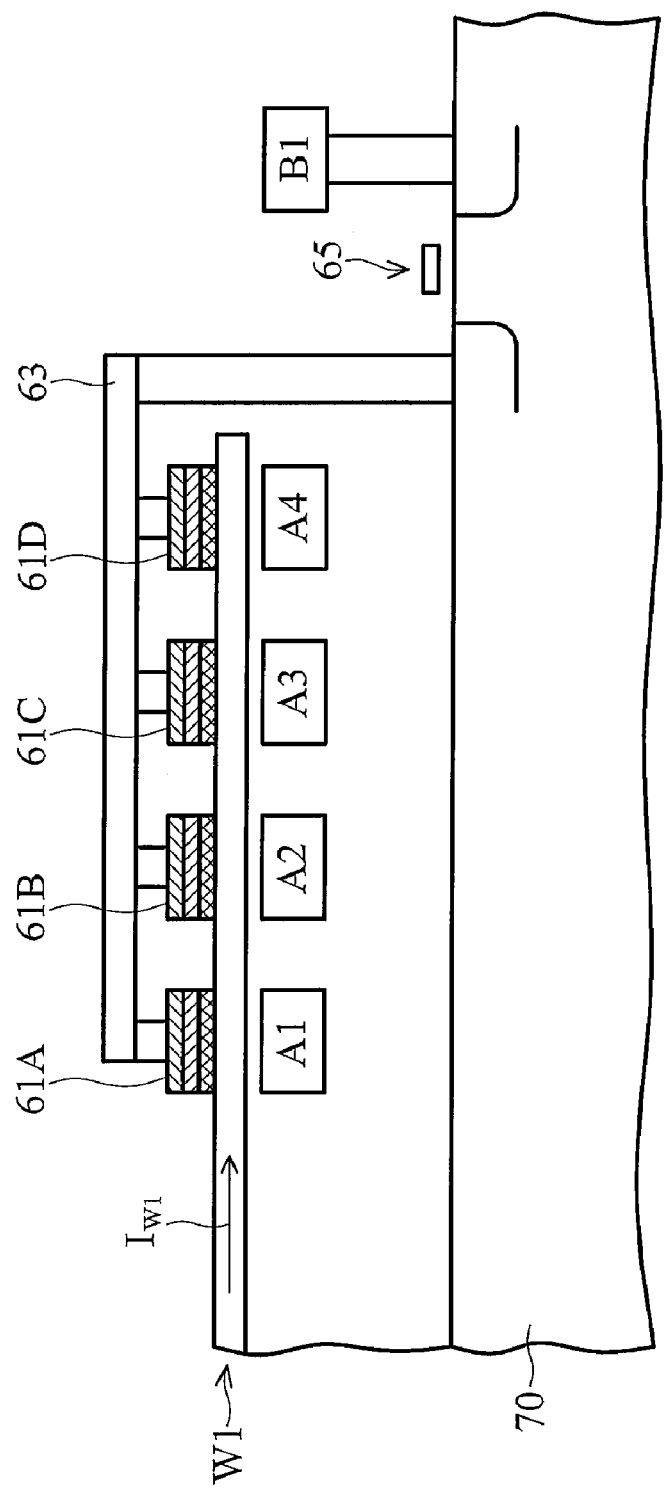
FIG. 21 illustrates a sectional view of a portion of the circuit shown in FIG. 20.
Figure 22:
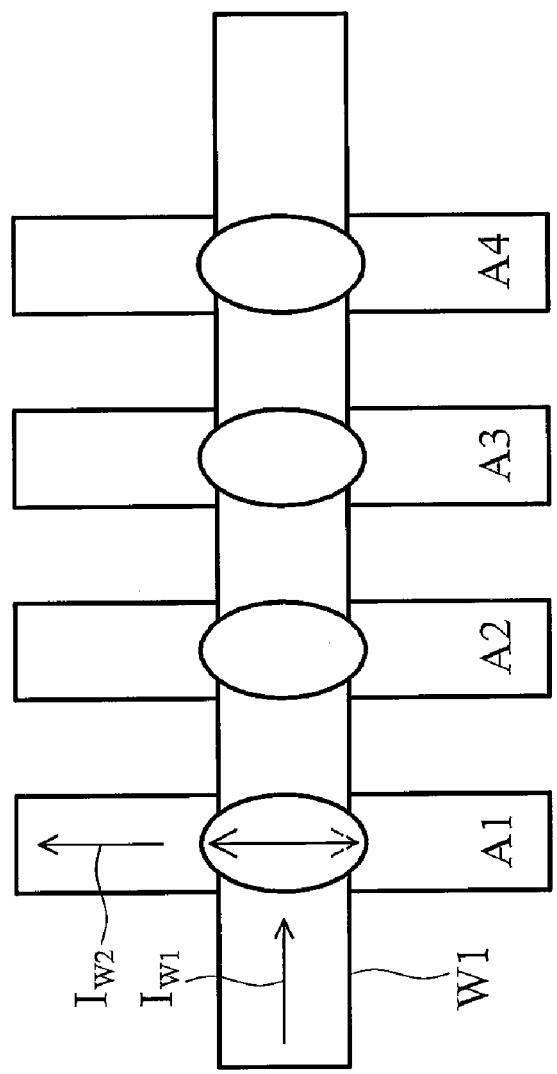
FIG. 22 illustrates a plan view of a portion of the circuit shown in FIG. 20.
Figure 22:
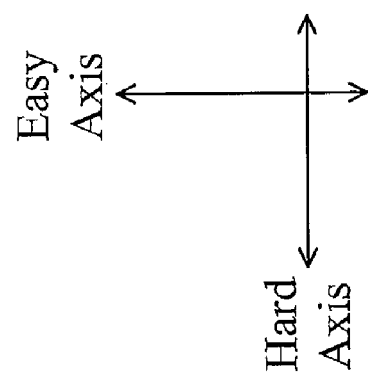

To write or change the state in the MTJ memory device 61A, an external magnetic field can be applied that is sufficient to completely switch the stable orientation of the free ferromagnetic layer in the MTJ memory device 61A. FIG. 21 shows a sectional view of a portion of the circuit 2000 shown in FIG. 20. FIG. 22 shows a plan view of a portion of the circuit 2000 shown in FIG. 20. In FIG. 21, the circuit is formed on the substrate 70. To write data to the MTJ memory device 61A, the word line WL1 and the programming line A1 are selected. Thus, a first write current Iw1 is applied to the selected word line WL1, and a second write current Iw2 is applied to the selected programming line A1. The first write current Iw1 generates a first writing magnetic field around the selected word line WL1. The second write current Iw2 generates a second writing magnetic field around the selected programming line A1. As a result, a combined magnetic field of both the first and second writing magnetic field generated by the current Iw1 and Iw2 is applied to the MTJ memory device 61A. In addition, the MRAM array circuit shown in FIG. 21 provides an example of forming one MRAM layer on the substrate 70. This can be duplicated one or more times to form a multi-layer MRAM architecture. For example, two circuit array layers in FIG. 21 can be formed overlapping on the substrate 70. Thus, memory capacity of a chip can be nearly doubled.

Figure 23:
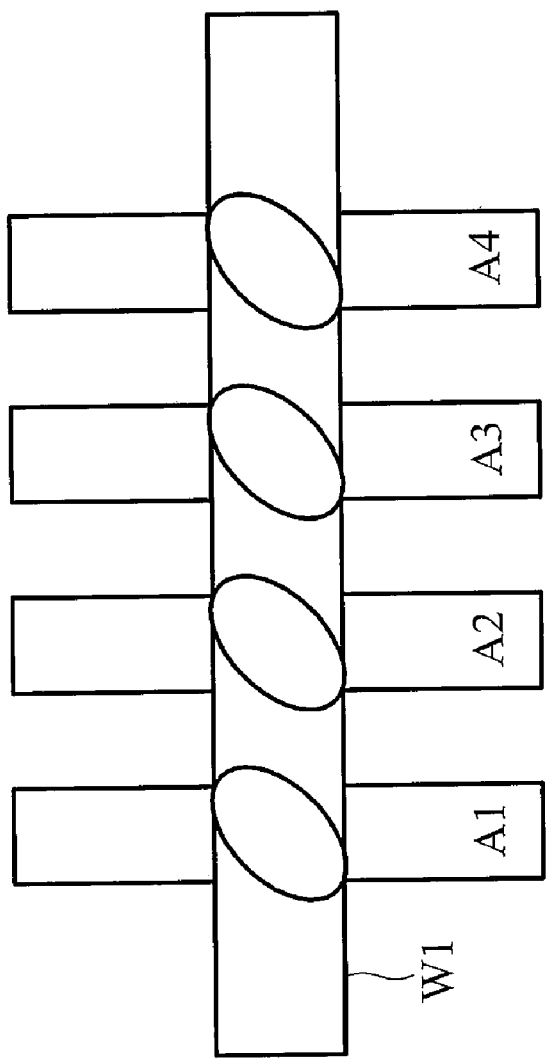
FIG. 23 illustrates another plan view of a portion of the circuit shown in FIG. 20.
Figure 23:
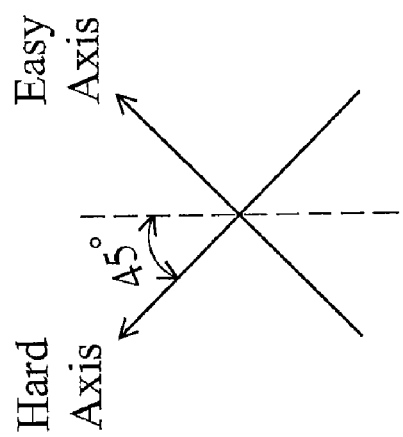

The magnetization directions of the free ferromagnetic layer in stable orientations are parallel to the easy axis, and perpendicular to the hard axis. In FIG. 22, the hard axis is perpendicular to the long-axis direction of the programming line A1. In another embodiment, the angle between the hard axis and the long-axis direction of the programming line A1 can be 45 degrees, as shown in the partial view in FIG. 23 of circuit 2000. The combined magnetic field of the first and second writing magnetic field exceeds a threshold magnetic field to switch the stable orientation of the magnetization of the free ferromagnetic layer in the written MTJ memory device. Thus, the selected MTJ memory device 61A stores binary digital data.

The read procedure of the MRAM array embodiment disclosed in FIGS. 20–23 may be described with reference back to the process of FIG. 11. Specifically, at step 210, a bit line B1 corresponding to the read MTJ memory device 61A is selected and a read voltage $V_{read}$ is applied thereto. At this time, a data line D1 corresponding to the read MTJ memory device 61A is also selected, and the word line W1 corresponding to the read MTJ memory device 61A is grounded so as to complete the electrical circuit. Thus, switch 65 is turned on, and a first read current Ir1 flows through bit line B1, switch 65, and the MTJ memory devices connected in parallel, to the grounded word line W1.

Next, at step 220, the first read current Ir1 is sampled and held by the sensing circuit 2010. Them, at step 230, an adjusting current $I_{adj}$ is applied to programming line A1 (i.e., along the hard axis of the MTJ device) to generate a "wiggle" magnetic field to temporarily change the magnetic moment of the free ferromagnetic layer of the read MTJ memory device 61A corresponding to the programming line A1. As before, the wiggle magnetic field is less than the threshold magnetic field such that the magnetism of the MTJ device 61A is not permanently flipped. In addition, the wiggle magnetic field has a non-zero portion along the hard axis, and wiggles the magnetic moment of the free ferromagnetic layer of the read MTJ memory device by a degree larger than 0 and smaller than 90. A second read current Ir2 is then applied through bit line B1, switch 65, and the MTJ memory devices connected in parallel, to the grounded word line W1. At step 240, the second read current Ir2 is sampled and held by the sensing circuit 2010, while the wiggle magnetic field is applied. It should also be noted that in all novel embodiments disclosed herein, depending on circuit design and application, the applied adjustable 'wiggle' signal (e.g., current or voltage) may be selected to permanently change the magnetic moment of the select cells, rather than providing only a temporary change. In such embodiments, the reading (and possibly writing) of the memory cells would be considered "destructive," and a further technique is employed to rewrite the read memory cells back to their original magnetic moment.

The sensing circuit 2010 then compares the first and second read currents Ir1, Ir2 at step 250. At the decision step 260, if the second current Ir2 is determined to exceed the first read current Ir1, a magnetization direction of the free ferromagnetic layer has been flipped to be anti-parallel to that of the pinned ferromagnetic layer in the read MTJ memory device by the wiggle current. Thus, the original magnetism direction of the free layer was parallel to the pinned layer, and thus the read MTJ bit 61A was originally parallel, as shown in step 270. If the first read current Ir1 exceeds the second read current Ir2 during application of the wiggle current $I_{adj}$, the magnetization direction of the free ferromagnetic layer was flipped to be parallel to that of the pinned ferromagnetic layer in the read MTJ memory device 61A. Thus, the original magnetism direction of the free layer was anti-parallel to the pinned layer, and thus the read MTJ bit 61A was originally parallel, as shown in step 275. The resistance present a given time ($R_{present}$) of a read MTJ memory device under application of the wiggle magnetic field in such embodiments can be expressed by equation (1):

$$R_{present} = R_{L+} \frac{R_H - R_L}{2} \times (1 - \cos\theta), \quad (1)$$

where $R_L$ is the relatively low resistance of the MTJ memory device when its free ferromagnetic layer and pinned ferromagnetic layer are parallel to each other, $R_H$ is the relatively high resistance of the MTJ memory device when its free ferromagnetic layer and pinned ferromagnetic layer are anti-parallel to each other, and θ is angle variation caused by the applied wiggle magnetic field.

Then, at step 280 the wiggle magnetic field is removed by stopping the adjusting current $I_{adj}$. Again, because the wiggle magnetic field is less than the threshold magnetic field to switch the stable resistance of the MTJ memory device, the magnetization direction of its free ferromagnetic layer returns to what is was before application of the wiggle magnetic field. Thus, the resistance of the read MTJ memory device after removing the wiggle magnetic field is the same as that before application of the wiggle magnetic field. Therefore, rewriting the original data back to the read memory cell after the reading procedure is not required, and thus not "destructive."

Figure 24:
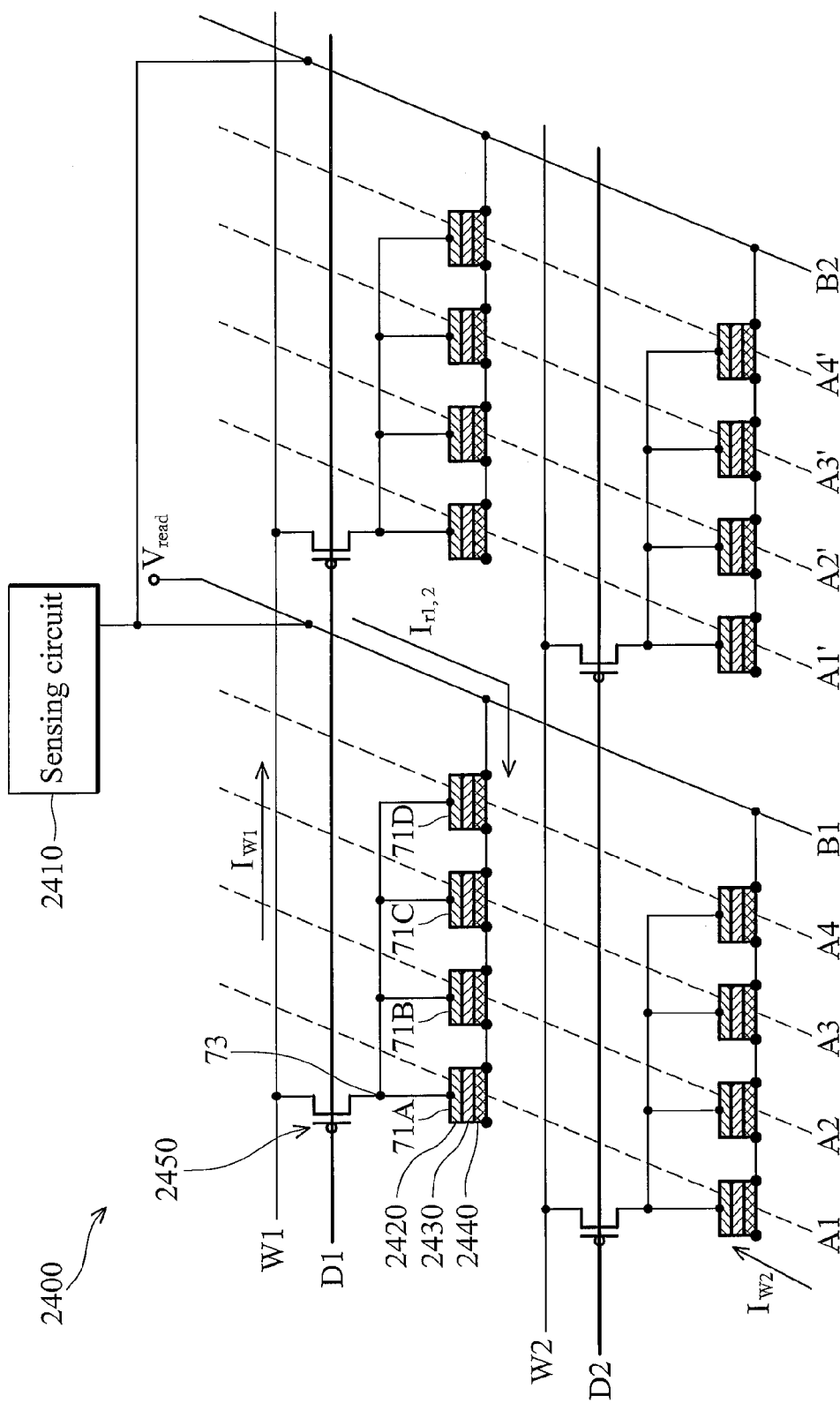
FIG. 24 illustrates a schematic circuit diagram illustrative of one memory array circuit of MTJ memory devices according to a second embodiment of a single switch arrangement disclosed herein.

FIG. 24 is a schematic circuit diagram illustrative of one memory array circuit 2400 of MTJ memory devices according to a second embodiment of a single switch arrangement disclosed herein. The MRAM array circuit 2400 comprises data lines D1 and D2, bit lines B1 and B2, and word lines W1 and W2. MTJ memory devices 71A, 71B, 71C, and 71D are connected in parallel between node 73 and bit line B1. Each MTJ memory device comprises a free ferromagnetic barrier 2420, a pinned ferromagnetic barrier 2440, and an insulating tunneling barrier 2430 located between the pinned ferromagnetic barrier 2440 and the free ferromagnetic barrier 2420. The free ferromagnetic barrier 2420 has a freely changeable magnetic moment, the pinned ferromagnetic barrier 2440 has a fixed magnetic moment, and the insulating tunneling barrier 2430 is a very thin insulation layer.

Switch 2450, an NMOS transistor in this example, is connected between word line W1 and the node 73, and is controlled by a selection signal provided by data line D1. In the exemplary embodiment of FIG. 24, the four MTJ memory devices 71A–71D are each allocated to the node 73. Instead of four MTJ memory devices, two or three memory devices, or more than four memory devices, can also be assigned to one node. Programming lines A1, A2, A3, and A4 are located near the corresponding MTJ memory devices 71A, 71B, 71C, and 71D, respectively. In addition, a sensing circuit 2410 detects the current flowing through bit lines B1 and B2.

To write data to MTJ memory device 71A, the word line WL1 and the programming line A1 are selected. Thus, a first write current Iw1 is applied to the selected word line WL1, and a second write current Iw2 is applied to the selected programming line A1. The first write current Iw1 generates a first writing magnetic field around the selected word line WL1. The second write current Iw2 generates a second writing magnetic field around the selected programming line A1. As a result, a combined magnetic field of both the first and second writing magnetic field generated by the current Iw1 and Iw2 is applied to the MTJ memory device 71A, which is sufficient to completely switch the stable orientation of the magnetization of the free ferromagnetic layer in the MTJ memory device 71A (see, e.g., FIG. 22).

The magnetization directions of the free ferromagnetic layer in stable orientations are parallel to the easy axis, and perpendicular to the hard axis. In some embodiments, the hard axis is perpendicular to the long-axis direction of the programming line A1. In other embodiments, the angle between the hard axis and the long-axis direction of the programming line A1 can be 45 degrees. The combined magnetic field of the first and second writing magnetic field exceeds a threshold magnetic field to switch the stable orientation of the magnetization of the free ferromagnetic layer in the written MTJ memory device. Thus, the selected MTJ memory device 71A stores binary digital data.

The read procedure of one embodiment again follows the process described in FIG. 11, this time with reference to FIG. 24. First, a bit line B1 corresponding to the read MTJ memory device 71A is selected and a read voltage $V_{read}$ is applied thereto (step 210). Next, a data line D1 corresponding to the read MTJ memory device 71A is selected, and the word line W1 corresponding to the read MTJ memory device 71A is grounded. Thus, switch 2450 is turned on, and a first current Ir1 flows through bit line B1, the MTJ memory devices connected in parallel, and switch 2450, to the grounded word line W1. Next, the first current Ir1 is obtained and held by sensing circuit 2410 (step 220). Next, a current $I_{adj}$ is applied to programming line A1 to generate a wiggle magnetic field to change the magnetic moment of the free ferromagnetic layer of the read MTJ memory device 71A corresponding to the programming line A1 (step 230). Here, the wiggle magnetic field is less than the threshold magnetic field. In addition, the wiggle magnetic field has a non-zero portion along the hard axis, and wiggles the magnetic moment of the free ferromagnetic layer of the read MTJ memory device by a degree larger than 0 and smaller than 90.

A second current Ir2 concurrently flows through bit line B1, the MTJ memory devices connected in parallel, and switch 2450, to the grounded word line W1. Next, the second current Ir2 is sampled and held by sensing circuit 76, while the wiggle magnetic field is applied (step 240). Next, sensing circuit 2410 compares the first and second current Ir2 (step 250). In the decision step 260, if the second current Ir2 exceeds the first current Ir1, the bit 71A is determined originally have been anti-parallel based on a magnetization direction during application of the wiggle current detected in the MTJ memory device 71A (step 270). If the first current Ir1 exceeds the second current Ir2, the bit 71A is determined originally have been parallel based on the magnetization direction during application of the wiggle current detected in the MTJ memory device 71A (step 275). As before, since the second current Ir2 reflects the total resistance between node 63 and word line W1, and the total resistance is changed by the resistance variation of the wiggled MTJ memory device, data stored in the wiggled MTJ memory device is obtained by the comparison of the first current Ir1 and the second current Ir2.

Next, the wiggle magnetic field is removed (step 280). Once again, because the wiggle magnetic field is less than the threshold magnetic field to switch the stable resistance of the MTJ memory device 71A, the magnetization direction of its free ferromagnetic layer returns to that before application of the wiggle magnetic field. Thus, the resistance of the read MTJ memory device 71A after removing the wiggle magnetic field is the same as that before application of the wiggle magnetic field. Therefore, rewriting the original data back to the read memory cell after the reading procedure is not required.

Figure 25:
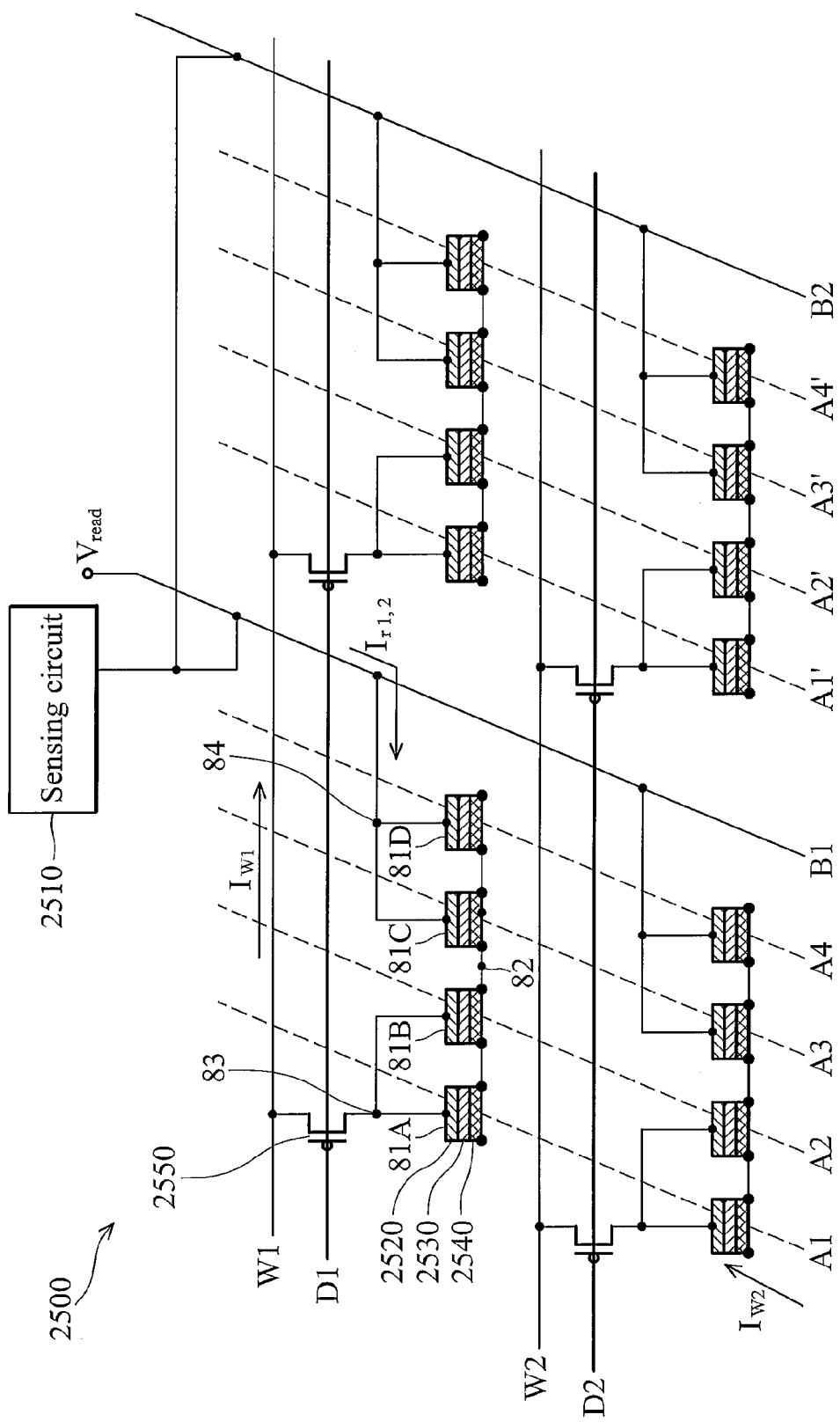
FIG. 25 illustrates is a schematic circuit diagram illustrative of one memory array of MTJ memory devices according to a third embodiment of the single switch arrangement disclosed herein.

FIG. 25 is a schematic circuit diagram illustrative of one memory array 2500 of MTJ memory devices according to a third embodiment of the single switch arrangement disclosed herein. The MRAM array circuit 2500 comprises data lines D1 and D2, bit lines B1 and B2, and word lines W1 and W2. MTJ memory devices 81A, and 81B are connected in parallel between nodes 82 and 83, MTJ memory devices 81C, and 81D are connected in parallel between node 82 and bit line B1. Here, the MTJ memory devices connected in parallel comprise a MTJ memory device group, and the MTJ memory device groups are connected in serial. For example, MTJ memory devices 81A and 81B comprise a first MTJ memory device group, MTJ memory devices 81C and 81D comprise a second MTJ memory device group, and the first and second MTJ memory device groups are connected in serial.

Figure 26:
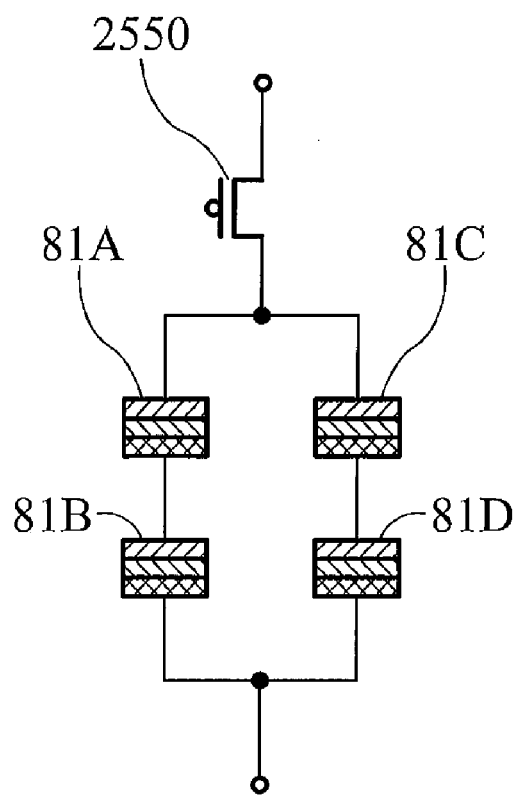
FIG. 26 illustrates an alternative grouping of MTJ devices for use with the circuit illustrated in FIG. 25.

In another embodiment, MTJ memory devices 81A and 81B are connected serially and comprise a first MTJ memory device group; MTJ memory devices 81C and 81D are connected serially and comprise a second MTJ memory device group; and the first and second MTJ memory device groups are connected in parallel, as shown in the MRAM array 2600 of FIG. 26. Even in such alternative embodiments, the connections of other signal lines, such as data line D1, bit line B1, word line W1, and programming lines A1~A4 are similar to those shown in FIG. 25.

In the exemplary embodiment of the circuit shown in FIG. 25, the two MTJ memory devices 81A and 81B are each allocated to the node 83, and the two MTJ memory devices 81C and 81D are each allocated to the node 82. Instead of these two MTJ memory devices, more than two memory devices can also belong to one MTJ memory device group. Each MTJ memory device again comprises a free ferromagnetic layer 2520, a pinned ferromagnetic layer 2540, and an insulating tunneling barrier 2530 located between the pinned ferromagnetic layer 2540 and the free ferromagnetic layer 2520. The free ferromagnetic layer 2520 has a freely changeable magnetic moment, the pinned ferromagnetic layer 2540 has a fixed magnetic moment, and the insulating tunneling barrier 2530 is a very thin insulation layer. Switch 2550, an NMOS transistor in this example, is connected between word line W1 and the node 83, controlled by a selection signal provided by data line D1. Programming lines A1, A2, A3, and A4 are located near the corresponding MTJ memory devices 81A, 81B, 81C, and 81D, respectively. In addition, a sensing circuit 2510 detects the current flowing through bit lines B1 and B2.

To write data to the MTJ memory device 81A, the word line WL1 and the programming line A1 are selected. Thus, a first write current Iw1 is applied to the selected word line WL1, and a second write current Iw2 is applied to the selected programming line A1. The first write current Iw1 generates a first writing magnetic field around the selected word line WL1. The second write current Iw2 generates a second writing magnetic field around the selected programming line A1. As a result, a combined magnetic field of both the first and second writing magnetic field generated by the current Iw1 and Iw2 is applied to the MTJ memory device 81A, which is sufficient to completely switch the stable orientation of the magnetization of the free ferromagnetic layer in the MTJ memory device The magnetization directions of the free ferromagnetic layer in stable orientations are parallel to the easy axis, and perpendicular to the hard axis. In this embodiment, the hard axis is perpendicular to the long-axis direction of the programming line A1. In another embodiment, the angle between the hard axis and the long-axis direction of the programming line A1 can be 45 degrees. The combined magnetic field of the first and second writing magnetic fields exceeds a threshold magnetic field to switch the stable orientation of the magnetization of the free ferromagnetic layer in the written MTJ memory device. Thus, the selected MTJ memory device 81A stores binary digital data.

The read procedure of one embodiment again follows the process described in FIG. 11, this time with reference to FIG. 25. First, a bit line B1 corresponding to the read MTJ memory device 81A is selected and a read voltage $V_{read}$ is applied thereto (step 210). Next, a data line D1 corresponding to the read MTJ memory device 81A is selected, and the word line W1 corresponding to the read MTJ memory device 81A is grounded. Thus, switch 2550 is turned ON, and a first current Ir1 flows through bit line B1, the MTJ memory devices 81A to 81D, and switch 2550, to the grounded word line W1. Next, the first current Ir1 is obtained and held by sensing circuit 2510 (step 220). Next, a current $I_{adj}$ is applied to programming line A1 to generate a wiggle magnetic field to change the magnetization of the free ferromagnetic layer of the read MTJ memory device 81A corresponding to the programming line A1 (step 230). Here, the wiggle magnetic field is less than the threshold magnetic field. In addition, the wiggle magnetic field has a non-zero portion along the hard axis, and wiggles the magnetic moment of the free ferromagnetic layer of the read MTJ memory device by a degree larger than 0 and smaller than 90.

A second current Ir2 concurrently flows through bit line B1, the MTJ memory devices 81A to 81D, and switch 2550, to the grounded word line W1. Next, the second current Ir2 is obtained and held by sensing circuit 2510, while the wiggle magnetic field is applying (step 240). Next, the sensing circuit 2510 compares the first Ir1 and second current Ir2 (step 250). In the decision step 260, if the second current Ir2 exceeds the first current Ir1, the bit 81A is determined originally have been anti-parallel based on a magnetization direction during application of the wiggle current detected in the MTJ memory device 81A (step 270). If the first current Ir1 exceeds the second current Ir2, the bit 81A is determined originally have been parallel based on the magnetization direction during application of the wiggle current detected in the MTJ memory device 81A (step 275). As before, since the second current Ir2 reflects the total resistance between node 63 and word line W1, and the total resistance is changed by the resistance variation of the wiggled MTJ memory device, data stored in the wiggled MTJ memory device is obtained by the comparison of the first current Ir1 and the second current Ir2. Since the second current Ir2 reflects the total resistance between node 83 and word line W1, and the total resistance is changed by the resistance variation of the wiggled MTJ memory device, data stored in the wiggled MTJ memory device is obtained by the comparison of the first current Ir1 and the second current Ir2.

Then, the wiggle magnetic field is removed (step 280). Because the wiggle magnetic field is less than the threshold magnetic field to switch the stable resistance of the MTJ memory device 81A, the magnetization direction of its free ferromagnetic layer returns to that before application of the wiggle magnetic field. Thus, the resistance of the read MTJ memory device 81A after removing the wiggle magnetic field is the same as that before application of the wiggle magnetic field. Therefore, rewriting the original data back to the read memory cell after the reading procedure is not required. It is noted that the data stored in the target MTJ memory device in any of the above embodiments is obtained using a sensing circuit for comparing the first current Ir1 and second current Ir2. However, the data stored in any target MTJ memory device can be also obtained by sensing the voltage levels at the target MTJ memory device before and after applying the wiggle magnetic field.

The present disclosure also introduces non-destructive techniques for writing and reading memory cells including, in one embodiment: (1) sampling and holding a first signal of a selected bit line; (2) applying a magnetic field along the hard axis of a free layer of each of a plurality of MTJ cell, wherein the field is sufficient to wiggle the magnetic moment of a selected free layer by a degree larger than 0 degrees and smaller than 90 degrees (an acute angle), and is not able to flip the magnetic moment; (3) sampling a second signal of the same bit line again while wiggling the free layer of the selected bit; and (4) comparing the first and second signals to determine or identify the state of the selected bit.

Thus, in accordance with the disclosed principles, many embodiments of MRAM arrays and related methods for writing/reading data to/from MRAM cells are disclosed. In one aspect, an array of magnetic memory cells is disclosed. Each of the memory cells comprise a stack of a free ferromagnetic layer, a pinned ferromagnetic layer, and an insulating tunneling barrier located therebetween, wherein a combination of a writing signal and a magnetic field may exceed a threshold magnetic field of corresponding select memory cells to alter the resistance of those memory cells.

In such embodiments, the array comprises a plurality of magnetic memory cells coupled together, and first conductive lines corresponding to each of the plurality of memory cells for applying an adjustable signal proximate to select ones of the memory cells to be read, where the adjustable signal creates a magnetic field sufficient to alter a magnetic moment of the select memory cells. The array also comprises a second conductive line perpendicular to the first conductive line for applying a first read signal through the plurality of memory cells, and for applying a second read signal to the plurality of memory cells while the adjustable signal is applied to the select memory cells. Also included is a sensing circuit coupled to the second conductive line and configured to compare the first reading signal to the second reading signal to determine a logic state of each of the select memory cells. Variations of MRAM arrays can include such an array, as well as:

further comprising a switching device coupled to the plurality of memory cells, where the switching device preventing current leakage from the memory cells when deactivated;

wherein the switching device is a transistor having a gate, a first source/drain and a second source/drain;

wherein the transistor is operable to read/write a logic state of each of the select memory cells, wherein the gate is coupled to a data line for applying a selection signal to the transistor, the first source/drain is collectively coupled to first terminals of the plurality of memory cells, the second source/drain is coupled to the second conductive line, and second terminals of the plurality of memory cells are collectively coupled to a third conductive line;

wherein the transistor is configured to provide the first and second read signals to the plurality of memory cells in response to the selection signal, while the third conductive line is configured to provide a ground for the plurality of memory cells, in order to read a logic state of each of the memory cells;

wherein the transistor is configured to provide a ground for the plurality of memory cells through the second conductive line in response to the selection signal, while the third conductive line is configured to provide a write signal to the plurality of memory cells, in order to write a logic state of each of the memory cells;

wherein the transistor is operable to read/write a logic state of each of the select memory cells, wherein the gate is coupled to a data line for applying a selection signal to the transistor, the first source/drain is collectively coupled to first terminals of the plurality of memory cells, the second source/drain is coupled to a third conductive line, and second terminals of the plurality of memory cells are collectively coupled to the second conductive line;

wherein the second conductive line is configured to provide the first and second read signals to the plurality of memory cells in response to the selection signal, while the transistor is configured to provide a ground for the plurality of memory cells through the third conductive line, in order to read a logic state of each of the memory cells;

wherein the transistor is configured to provide a write signal through the third conductive line to the plurality of memory cells in response to the selection signal, while the second conductive line is configured to provide a ground for the plurality of memory cells, in order to write a logic state of each of the memory cells;

further comprising two switching devices coupled to opposing ends of the plurality of memory cells, the plurality of switching device parallel-coupled together between the switching devices, the switching devices preventing current leakage from the memory cells when deactivated;

wherein the switching devices are transistors each having a gate, a first source/drain and a second source/drain;

wherein the transistors are operable to read/write a logic state of each of the select memory cells, wherein their gates are coupled to a data line for applying a selection signal to the transistors, their first source/drains are coupled to respective third conductive lines, their second source/drains are coupled to first terminals of the plurality of memory cells, and second terminals of the plurality of memory cells are collectively coupled to the second conductive line;

wherein the second conductive line is configured to provide the first and second read signals to the plurality of memory cells in response to the selection signal, while the transistors are configured to provide a ground for the plurality of memory cells through the third conductive lines, in order to read a logic state of each of the memory cells;

wherein the transistors are configured to provide a write signal through the third conductive lines to the plurality of memory cells in response to the selection signal, while the second conductive line is configured to provide a ground for the plurality of memory cells, in order to write a logic state of each of the memory cells;

wherein the first and second signals comprise electrical current or voltage;

wherein the plurality of magnetic memory cells are coupled together in parallel;

wherein the plurality of magnetic memory cells are coupled together through a first group of the plurality of memory cells series-coupled together and a second group of the plurality of memory cells series-coupled together, with the first group parallel-coupled to the second group;

wherein the adjustable signal is sufficient to only temporarily alter a magnetic moment of the select memory cells, the magnetic moment of the select memory cells returning to their original magnetic moment after removal of the adjustable signal;

wherein the adjustable signal is sufficient to alter the magnetic moment of the select memory cells by an acute angle;

wherein the acute angle is about 45 degrees;

wherein the magnetic memory cells are magnetic random access memory (MRAM) cells comprising a magnetic tunnel junction (MTJ) stack having a plurality of layers, and wherein the adjustable signal applies a magnetic field along a hard axis of the MTJ stack of the select memory cells.

In other aspects, methods of determining a logic state of select magnetic memory cells on an array are also disclosed. In such methods, each of the memory cells comprise a stack of a free ferromagnetic layer, a pinned ferromagnetic layer, and an insulating tunneling barrier located therebetween, wherein a combination of a writing signal and a magnetic field may exceed a threshold magnetic field of corresponding select memory cells to alter the resistance of those memory cells. In one embodiment, such a method comprises applying a first signal through a plurality of the memory cells coupled together, and detecting the first signal. In addition, the method includes applying an adjustable signal proximate to the select memory cells, where the adjustable signal creates a magnetic field sufficient to alter a magnetic moment of the select memory cells, and then applying a second signal to the plurality of memory cells while applying the adjustable signal and detecting the second signal. Also, such methods comprise comparing the second signal to the first signal to determine a logic state of each of the select memory cells. Variations of such methods can include such a method, as well as:

wherein applying the first signal comprises employing a switching device coupled to the plurality of memory cells, the switching device preventing current leakage from the memory cells when deactivated;

wherein the switching device is a transistor having a gate, a first source/drain and a second source/drain;

wherein the transistor is activated to read/write a logic state of each of the select memory cells, and wherein the gate is coupled to a data line, the first source/drain is collectively coupled to first terminals of the plurality of memory cells, the second source/drain is coupled to a bit line connected to a comparison circuit providing the comparing, and the second terminals of the plurality of memory cells are collectively coupled to a word line;

wherein the first and second signals are applied to the plurality of memory cells through the transistor via the bit line, and the second terminals are grounded via the word line, to read a logic state of each of the memory cells;

wherein a write signal is applied to the plurality of memory cells via the word line, and the second terminals are grounded through the transistor via the bit line, to write a logic state of each of the memory cells;

wherein the transistor is activated to read/write a logic state of each of the select memory cells, and wherein the gate is coupled to a data line, the first source/drain is collectively coupled to first terminals of the plurality of memory cells, the second source/drain is coupled to a word line, and the second terminals of the plurality of memory cells are collectively coupled to a bit line connected to a comparison circuit providing the comparing;

wherein the first and second signals are applied to the plurality of memory cells via the bit line, and the second terminals are grounded through the transistor via the word line, to read a logic state of each of the memory cells;

wherein a write signal is applied to the plurality of memory cells through the transistor via the word line, and the second terminals are grounded via the bit line, to write a logic state of each of the memory cells;

wherein applying the first signal comprises employing two switching devices coupled to opposing sides of the plurality of memory cells, the plurality of memory cells parallel-coupled together, and the switching devices preventing current leakage from the memory cells when deactivated;

wherein the switching devices are transistors each having a gate, a first source/drain and a second source/drain;

wherein the transistors are activated to read/write a logic state of each of the select memory cells, and wherein their gates are coupled to a word line, their first source/drains are coupled to respective first and second bit lines, their second source/drains are coupled to the first terminals of the plurality of memory cells, and the second terminals of the plurality of memory cells are collectively coupled to a read line connected to a comparison circuit providing the comparing;

wherein the first and second signals are applied to the plurality of memory cells via the read line, and the second terminals are grounded through the transistors via the first and second bit lines, to read a logic state of each of the memory cells;

wherein a write signal is applied to the plurality of memory cells through the transistors via the bit lines, and the second terminals are grounded via the read line, to write a logic state of each of the memory cells;

wherein the first and second signals comprise electrical current or voltage;

wherein coupled together comprises the plurality of memory cells parallel-coupled to each other;

wherein coupled together comprises a first group of the plurality of memory cells series-coupled together and a second group of the plurality of memory cells series-coupled together, with the first group parallel-coupled to the second group;

wherein applying the adjustable signal comprises applying an adjustable signal proximate to the select memory cells sufficient to only temporarily alter a magnetic moment of the select memory cells, the magnetic moment of the select memory cells returning to their original magnetic moment after removal of the adjustable signal;

wherein applying the adjustable signal comprises applying an adjustable signal sufficient to alter the magnetic moment of the select memory cells by an acute angle;

wherein the acute angle is about 45 degrees;

wherein the magnetic memory cells are magnetic random access memory (MRAM) cells comprising a magnetic tunnel junction (MTJ) stack having a plurality of layers, and wherein the adjustable signal applies a magnetic field along a hard axis of the MTJ stack of the select memory cells.

While various embodiments of the disclosed principles have been described above, it should be understood that they have been presented by way of example only, and not limitation. Thus, the breadth and scope of the invention(s) should not be limited by any of the above-described exemplary embodiments, but should be defined only in accordance with any claims and their equivalents issuing from this disclosure. Furthermore, the above advantages and features are provided in described embodiments, but shall not limit the application of such issued claims to processes and structures accomplishing any or all of the above advantages.

Additionally, the section headings herein are provided for consistency with the suggestions under 37 CFR 1.77 or otherwise to provide organizational cues. These headings shall not limit or characterize the invention(s) set out in any claims that may issue from this disclosure. Specifically and by way of example, although the headings refer to a "Technical Field," such claims should not be limited by the language chosen under this heading to describe the so-called technical field. Further, a description of a technology in the "Background" is not to be construed as an admission that technology is prior art to any invention(s) in this disclosure. Neither is the "Brief Summary" to be considered as a characterization of the invention(s) set forth in issued claims. Furthermore, any reference in this disclosure to "invention" in the singular should not be used to argue that there is only a single point of novelty in this disclosure. Multiple inventions may be set forth according to the limitations of the multiple claims issuing from this disclosure, and such claims accordingly define the invention(s), and their equivalents, that are protected thereby. In all instances, the scope of such claims shall be considered on their own merits in light of this disclosure, but should not be constrained by the headings set forth herein.

What is claimed is:

1. An array of magnetic memory cells, each of the memory cells comprising a stack of a free ferromagnetic layer, a pinned ferromagnetic layer, and an insulating tunneling barrier located therebetween, wherein a combination of a writing signal and a magnetic field may exceed a threshold magnetic field of corresponding select memory cells to alter the resistance of those memory cells, the array comprising:
   a plurality of magnetic memory cells coupled together;
   first conductive lines corresponding to each of the plurality of memory cells for applying an adjustable signal proximate to select ones of the memory cells to be read, the adjustable signal creating a magnetic field sufficient to alter a magnetic moment of the select memory cells;
   a second conductive line perpendicular to the first conductive line for applying a first read signal through the plurality of memory cells, and for applying a second read signal to the plurality of memory cells while the adjustable signal is applied to the select memory cells; and
   a sensing circuit coupled to the second conductive line and configured to compare the first reading signal to the second reading signal to determine a logic state of each of the select memory cells.

2. An array according to claim 1, further comprising a switching device coupled to the plurality of memory cells, the switching device preventing current leakage from the memory cells when deactivated.

3. An array according to claim 2, wherein the switching device is a transistor having a gate, a first source/drain and a second source/drain, and wherein the transistor is operable to read/write a logic state of each of the select memory cells, wherein the gate is coupled to a data line for applying a selection signal to the transistor, the first source/drain is collectively coupled to first terminals of the plurality of memory cells, the second source/drain is coupled to the second conductive line, and second terminals of the plurality of memory cells are collectively coupled to a third conductive line.

4. An array according to claim 2, wherein the switching device is a transistor having a gate, a first source/drain and a second source/drain, and wherein the transistor is operable to read/write a logic state of each of the select memory cells, wherein the gate is coupled to a data line for applying a selection signal to the transistor, the first source/drain is collectively coupled to first terminals of the plurality of memory cells, the second source/drain is coupled to a third conductive line, and second terminals of the plurality of memory cells are collectively coupled to the second conductive line.

5. An array according to claim 1, further comprising two switching devices respectively coupled to opposing ends of the plurality of memory cells, the plurality of switching device parallel-coupled together between the switching devices, the switching devices preventing current leakage from the memory cells when deactivated.

6. An array according to claim 5, wherein the switching devices are transistors each having a gate, a first source/drain and a second source/drain, and wherein the transistors are operable to read/write a logic state of each of the select memory cells, wherein their gates are coupled to a data line for applying a selection signal to the transistors, their first source/drains are coupled to respective third conductive lines, their second source/drains are coupled to first terminals of the plurality of memory cells, and second terminals of the plurality of memory cells are collectively coupled to the second conductive line.

7. An array according to claim 1, wherein the first and second signals comprise electrical current or voltage.

8. An array according to claim 1, wherein the plurality of magnetic memory cells are coupled together in parallel.

9. An array according to claim 1, wherein the plurality of magnetic memory cells are coupled together through a first group of the plurality of memory cells series-coupled together and a second group of the plurality of memory cells series-coupled together, with the first group parallel-coupled to the second group.

10. An array according to claim 1, wherein the adjustable signal is sufficient to only temporarily alter a magnetic moment of the select memory cells, the magnetic moment of the select memory cells returning to their original magnetic moment after removal of the adjustable signal.

11. A method of determining a logic state of select magnetic memory cells on an array, each of the memory cells comprising a stack of a free ferromagnetic layer, a pinned ferromagnetic layer, and an insulating tunneling barrier located therebetween, wherein a combination of a writing signal and a magnetic field may exceed a threshold magnetic field of corresponding select memory cells to alter the resistance of those memory cells, the method comprising:
   applying a first signal through a plurality of the memory cells coupled together;

detecting the first signal;

applying an adjustable signal proximate to the select memory cells, the adjustable signal creating a magnetic field sufficient to alter a magnetic moment of the select memory cells;

applying a second signal to the plurality of memory cells while applying the adjustable signal;

detecting the second signal; and comparing the second signal to the first signal to determine a logic state of each of the select memory cells.

12. A method according to claim 11, wherein applying the first signal comprises employing a switching device coupled to the plurality of memory cells, the switching device preventing current leakage from the memory cells when deactivated.

13. A method according to claim 12, wherein the switching device is a transistor having a gate, a first source/drain and a second source/drain, and wherein the transistor is activated to read/write a logic state of each of the select memory cells, and wherein the gate is coupled to a data line, the first source/drain is collectively coupled to first terminals of the plurality of memory cells, the second source/drain is coupled to a bit line connected to a comparison circuit providing the comparing, and the second terminals of the plurality of memory cells are collectively coupled to a word line.

14. A method according to claim 12, wherein the switching device is a transistor having a gate, a first source/drain and a second source/drain, and wherein the transistor is activated to read/write a logic state of each of the select memory cells, and wherein the gate is coupled to a data line, the first source/drain is collectively coupled to first terminals of the plurality of memory cells, the second source/drain is coupled to a word line, and the second terminals of the plurality of memory cells are collectively coupled to a bit line connected to a comparison circuit providing the comparing.

15. A method according to claim 11, wherein applying the first signal comprises employing two switching devices respectively coupled to opposing sides of the plurality of memory cells, the plurality of memory cells parallel-coupled together, and the switching devices preventing current leakage from the memory cells when deactivated.

16. A method according to claim 15, wherein the switching devices are transistors each having a gate, a first source/drain and a second source/drain, and wherein the transistors are activated to read/write a logic state of each of the select memory cells, and wherein their gates are coupled to a word line, their first source/drains are coupled to respective first and second bit lines, their second source/drains are coupled to the first terminals of the plurality of memory cells, and the second terminals of the plurality of memory cells are collectively coupled to a read line connected to a comparison circuit providing the comparing.

17. A method according to claim 11, wherein the first and second signals comprise electrical current or voltage.

18. A method according to claim 11, wherein coupled together comprises the plurality of memory cells parallel-coupled to each other.

19. A method according to claim 11, wherein coupled together comprises a first group of the plurality of memory cells series-coupled together and a second group of the plurality of memory cells series-coupled together, with the first group parallel-coupled to the second group.

20. A method according to claim 11, wherein applying the adjustable signal comprises applying an adjustable signal proximate to the select memory cells sufficient to only temporarily alter a magnetic moment of the select memory cells, the magnetic moment of the select memory cells returning to their original magnetic moment after removal of the adjustable signal.

* * * * *